United States Patent
Patra et al.

(10) Patent No.: US 11,177,626 B2
(45) Date of Patent: Nov. 16, 2021

(54) CTE-TUNED PYROLYTIC GRAPHITE (PG) SUBSTRATE TO MINIMIZE JOINING STRESS BETWEEN LASER DIODE AND THE SUBSTRATE

(71) Applicant: Lawrence Livermore National Security, LLC, Livermore, CA (US)

(72) Inventors: Susant Patra, Brentwood, CA (US); Robert J. Deri, Pleasanton, CA (US); John W. Elmer, Danville, CA (US)

(73) Assignee: Lawrence Liveremore National Security, LLC, Livermore, CA (US)

( * ) Notice: Subject to any disclaimer, the term of this patent is extended or adjusted under 35 U.S.C. 154(b) by 89 days.

(21) Appl. No.: 15/080,516

(22) Filed: Mar. 24, 2016

(65) Prior Publication Data

US 2020/0227884 A1    Jul. 16, 2020

Related U.S. Application Data

(60) Provisional application No. 62/137,368, filed on Mar. 24, 2015.

(51) Int. Cl.
| | | |
|---|---|---|
| *H01S 5/024* | (2006.01) | |
| *H01S 5/02* | (2006.01) | |
| *H01S 5/323* | (2006.01) | |
| *H01L 23/522* | (2006.01) | |
| *H01L 23/532* | (2006.01) | |
| *H01S 5/40* | (2006.01) | |

(52) U.S. Cl.
CPC ...... *H01S 5/02469* (2013.01); *H01L 23/5226* (2013.01); *H01L 23/53228* (2013.01); *H01S 5/021* (2013.01); *H01S 5/024* (2013.01); *H01S 5/0206* (2013.01); *H01S 5/32316* (2013.01); *H01S 5/02423* (2013.01); *H01S 5/4025* (2013.01)

(58) Field of Classification Search
CPC ............... H01S 5/02469; H01S 5/0206; H01S 5/32316; H01S 5/024; H01S 5/02423; H01S 5/4025
See application file for complete search history.

(56) References Cited

U.S. PATENT DOCUMENTS

| | | | |
|---|---|---|---|
| 5,028,106 A | | 7/1991 | Hockaday |
| 5,844,310 A | * | 12/1998 | Okikawa ............. H01L 23/3733 257/712 |
| 5,987,043 A | * | 11/1999 | Brown ................ H01S 5/02252 347/237 |
| 7,808,787 B2 | | 10/2010 | Lemak et al. |

(Continued)

OTHER PUBLICATIONS

Lemak, Richard J., "High Performance Pyrolytic Graphite Heat Spreaders: Near Isotropic Structures and Metallization", IMAPS Advanced Technology Workshop on Thermal Management, Palo Alto, CA Oct. 13-16, 2008, pp. 1-25.

*Primary Examiner* — Yuanda Zhang
(74) *Attorney, Agent, or Firm* — James S. Tak

(57) ABSTRACT

A pyrolytic graphite (PG) substrate and laser diode package includes a substrate body having a PG crystalline structure with a basal plane oriented at a pre-determined orientation angle as measured from a longitudinal axis of a heat generating material, such as a laser diode, mounted on a surface of the PG substrate, so that a coefficient of thermal expansion (CTE) of the PG substrate is substantially matched with a CTE of the material.

4 Claims, 20 Drawing Sheets

(56) References Cited

U.S. PATENT DOCUMENTS

| | | |
|---|---|---|
| 8,059,408 B2 | 11/2011 | Lemak et al. |
| 8,085,531 B2 | 12/2011 | Lemak et al. |
| 2008/0008216 A1 | 1/2008 | Miller et al. |
| 2009/0255660 A1 | 10/2009 | Cornie et al. |
| 2010/0177796 A1* | 7/2010 | Miller .................... H01S 5/024 372/36 |
| 2011/0014417 A1* | 1/2011 | Lemak ................ H01L 23/4006 428/99 |
| 2012/0234524 A1 | 9/2012 | Fan et al. |

* cited by examiner

CTE-TUNED PYROLYTIC GRAPHITE (PG) SUBSTRATE TO MINIMIZE JOINING STRESS BETWEEN LASER DIODE AND THE SUBSTRATE

CROSS-REFERENCE TO RELATED APPLICATIONS

This application claims the benefit of U.S. provisional application No. 62/137,368 filed Mar. 24, 2015, which is incorporated by reference herein.

FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

BACKGROUND

The present invention generally relates to laser diode packages, and more particularly to a pyrolytic graphite (PG) substrate and a laser diode package using the pyrolytic substrate which has been cut at an anisotropy orientation angle that substantially matches the coefficient of thermal expansion (CTE) of a GaAs laser diode to reduce stress between the laser diode and the substrate.

Semiconductor laser diodes and high power electronic devices must be mounted to substrates with low strain in order to achieve high device reliability. These submounts typically must be CTE-matched to the semiconductor chip to achieve low strain, and also must provide good thermal conductivity and good electrical conductivity.

For GaAs-based semiconductor devices (laser diodes, mobile phone power amps), the CTE matched substrates currently used are CuW pseudoalloys, beryllium oxide ceramics, and Cu—Mo—Cu laminated composites. These materials are relatively expensive to produce. For example, CuW is difficult to machine due to its high tungsten content. Cu—Mo—Cu multilayers cannot be made thinner than ~0.5 mm, which prevents high density packaging of multiple semiconductor chips. Because of these limitations, these submounts are difficult to incorporate in high volume batch process packaging.

What is needed thereof is a CTE-matched substrate for low cost laser diode packaging that reduces stress between laser diodes and substrates during the die attach process without compromising diode efficiency due to excess electrical resistance, and enables low cost mounting of semiconductor die using conventional semiconductor processing technology.

SUMMARY

In one exemplary embodiment, the present invention includes a pyrolytic graphite (PG) substrate comprising: a substrate body having a PG crystalline structure with a basal plane oriented at a pre-determined orientation angle as measured from a longitudinal axis of a heat generating material to be mounted on a surface of the PG substrate, so that a coefficient of thermal expansion (CTE) of the PG substrate is substantially matched with a CTE of the material.

In another embodiment example embodiment, the present invention includes a pyrolytic graphite (PG) substrate comprising: a substrate body having a PG crystalline structure with at least two progressively tiered mounting surfaces for mounting a heat generating material having longitudinal axes parallel to each other, and a basal plane oriented at a pre-determined orientation angle as measured from the longitudinal axes, so that a coefficient of thermal expansion (CTE) of the PG substrate is substantially matched with a CTE of the material.

In another embodiment example embodiment, the present invention includes a laser diode package comprising: a laser diode having a longitudinal axis; and a pyrolytic graphite (PG) substrate body having a mounting surface on which the laser diode is mounted and a PG crystalline structure with a basal plane oriented at a pre-determined orientation angle as measured from the longitudinal axis of the laser diode so that a coefficient of thermal expansion (CTE) of the PG substrate is substantially matched with a CTE of the laser diode.

And in other example embodiments, the present invention may additional include one or more of the following: wherein the longitudinal axis of the heat generating material to be mounted is substantially parallel to a plane of a mounting surface of the material; wherein the basal plane is substantially orthogonal to the plane of the mounting surface but substantially non-orthogonal to the longitudinal axis; wherein the heat generating material to be mounted is a GaAs laser diode; wherein the basal plane is substantially non-orthogonal to the plane of the mounting surface but the intersection of the basal plane and the plane of the mounting surface is substantially orthogonal to the longitudinal axis; wherein; wherein the basal plane is substantially parallel to the longitudinal axis but substantially non-orthogonal to the plane of the mounting surface; further comprising a second substrate body connected to the first substrate body and having a PG crystalline structure with a basal plane oriented at a pre-determined orientation angle as measured from the longitudinal axis; wherein the longitudinal axis of the heat generating material to be mounted is substantially parallel to a plane of a mounting surface of the material; wherein the basal plane of the second substrate body is substantially parallel to the longitudinal axis but substantially non-orthogonal to the plane of the mounting surface; or wherein the basal plane of the second substrate body is substantially parallel to the plane of the mounting surface.

These and other implementations and various features and operations are described in greater detail in the drawings, the description and the claims.

Generally, the present invention is directed to a tuned pyrolytic graphite (PG) substrate and a laser diode package (including a diode stack) suitable for batch process packaging due to its ease of machining and electroplating. Tuned PG enables the custom fabrication of a substrate that has the CTE and thermal conductivity characteristics similar better than to CuW/Cu-Moly substrate, with and improved laser diode array stacking fidelity. The present invention creates a thermal expansion-matched ("CTE matched") substrate with good thermal conductivity to reduce stress between laser diodes and substrates during die attach process. A tuned PG substrate is designed to match the CTE of, for example, a GaAs laser diode, without compromising diode efficiency due to excess thermal resistance. It relies on CTE and thermal conductivity dependence on orientation of single graphite crystal within the polycrystalline PG structure. This invention provides a structurally and thermally efficient alternative for mounting semiconductor die with low strain, without compromising thermal or electrical performance.

The principal advantages of this invention are that it enables manufacture of expansion-matched substrates using standard semiconductor processing technology, without the need for exotic materials that are expensive to produce and difficult to shape and finish. The approach can be applied for a wide range of substrate thicknesses. The approach provides thermal performance better than today's industry standard (90/10 tungsten/copper pseudoalloy). It also enables batch packaging of laser diodes using a wafer-level process, which can both improve reduce manufacturing costs and increase manufacturing yields. These structures enable batch processing for reduced cost.

Dual optimization of thermal and stress considerations is made possible by the highly anisotropic properties of pyrolytic graphite, which has large crystallographic orientation differences in CTE and thermal conductivity. In this approach, a PG substrate is taken and machined or otherwise cut in at least one of x,y and z directions parallel to a pre-determined single crystal graphite orientation. The orientation may be characterized by an orientation angle. And orientation angle may be characterized as the angle of deviation/rotation from a frame of reference such as from a reference axis or axes. And orientation angle may in the alternative be characterized as the angular deviation of the basal plane from a longitudinal axis of the laser diode die. It is notable that while the orientation angle θ is used in many of the experiment based graphs according to the first characterization, the claims however use the term orientation angle according to the second characterization.

While the present application describes the approach specifically to mounting laser diode devices, it is appreciated that the same approach may be used to provide a CTE-matched substrate or package for other heat generating devices, such as other high-power semiconductor devices, such as GaAs-based power amplifier chips for cell phones, and possibly high power electronic devices for electric vehicles and other applications in electrical power generation and switching and the device characteristics is sensitive to the bonding stress.

BRIEF DESCRIPTION OF THE DRAWINGS

The accompanying drawings, which are incorporated into and forma a part of the disclosure, are as follows.

DETAILED DESCRIPTION

Figure 4:
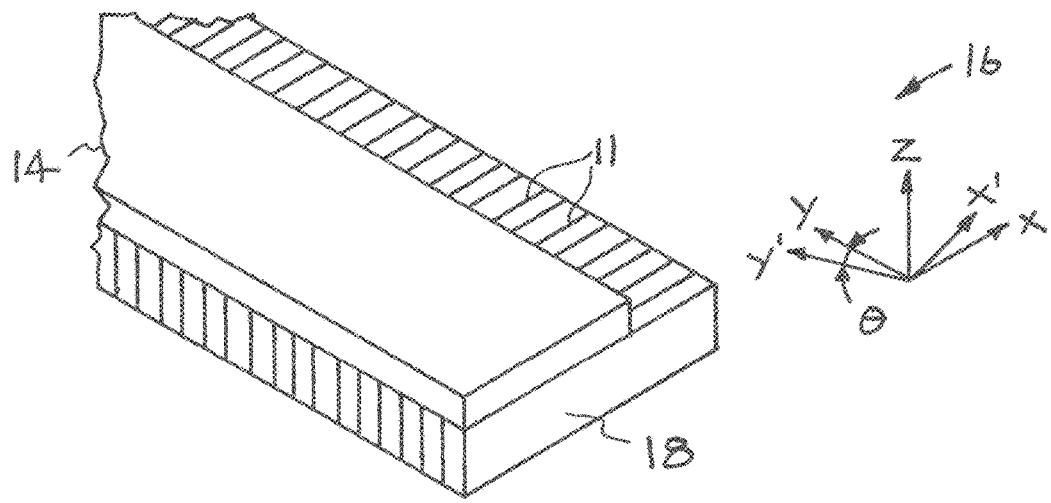
FIG. 4 is a perspective view of one end of a schematic laser diode package arranged as Configuration 1, showing a long axis of the laser diode arranged approximately orthogonal to basal plane of a PG substrate before being angled to a pre-determined orientation angle.
Figure 7:
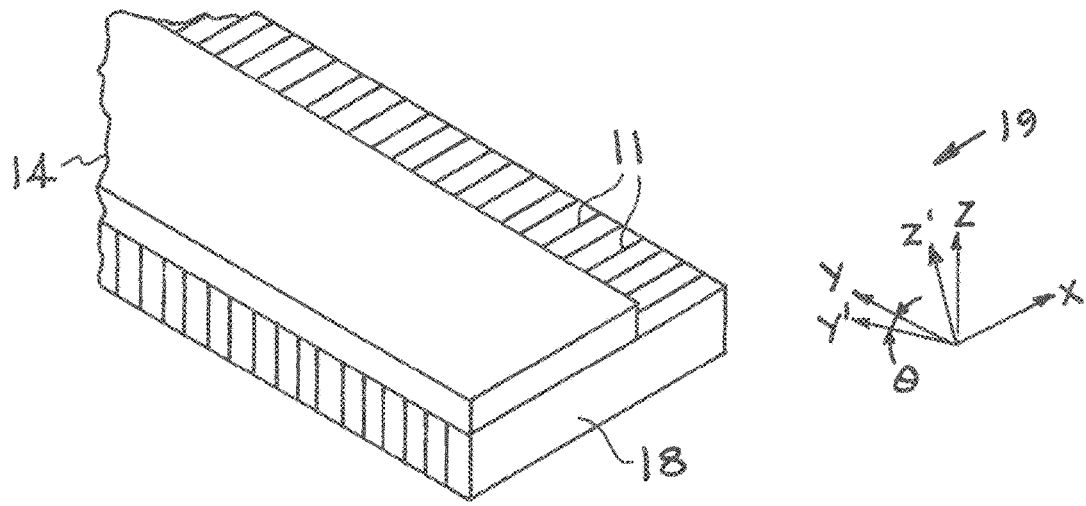
FIG. 7 is a perspective view of one end of a schematic laser diode package arranged as Configuration 3, showing a long axis of the laser diode arranged approximately orthogonal to basal plane of a PG substrate before being angled to a pre-determined orientation angle.
Figure 12:
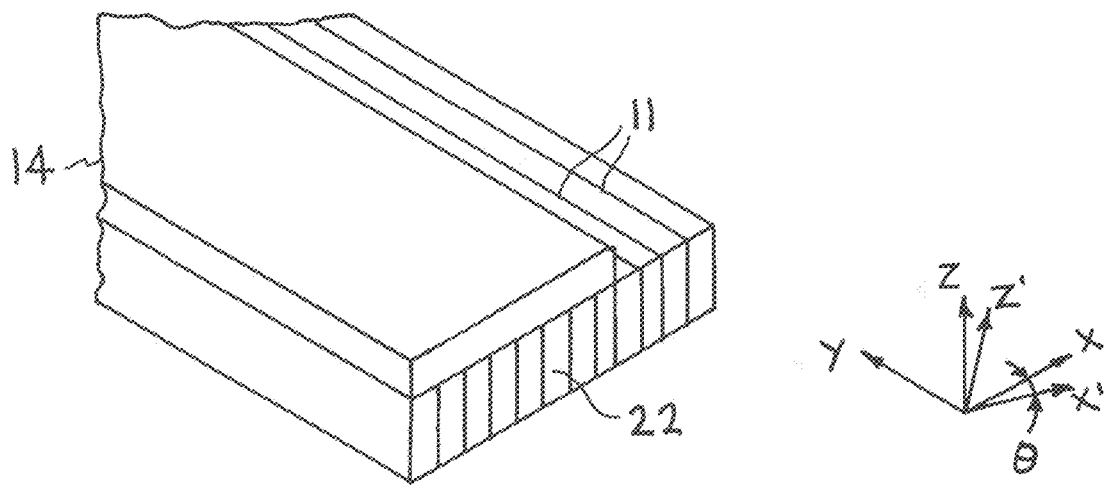
FIG. 12 is a perspective view of one end of a schematic laser diode package arranged as Configuration 2, showing a long axis of the laser diode arranged approximately parallel to basal plane of a PG substrate before being angled to a pre-determined orientation angle.

Generally, three basic orientations of the PG crystal structure can be achieved during assembly and used in the present invention. They are characterized as Configurations 1, 2, and 3, and are schematically shown in FIGS. 4, 7 and 12. Generally in each of FIGS. 4, 7, and 12, the PG substrate (15, 18, and 22 respectively) is shown with cross hatching lines indicating the basal plane of the graphite structure where thermal conductivity is high within the plane, but low normal to the basal plane. The CTE, behaves opposite to this behavior, being low in the basal plane and high in the direction normal to the basal plane. Each PG substrate also has attached and mounted on a top mounting surface a laser diode die 14 arranged so that its longitudinal axis is substantially orthogonal to (FIGS. 4, 7) or substantially parallel to (FIG. 12) the basal plane. Furthermore, the PG substrates 15 (FIG. 4), 18 (FIG. 7), and 22 (FIG. 12) are each shown with orientation angle θ=0. However, the reference axes 15 (FIG. 4) indicates that θ is rotated about the Z reference axis, the reference axes 19 (FIG. 7) indicates that θ is rotated about the X reference axis, and the reference axes 23 (FIG. 12 (indicates that θ is rotated about the Y reference axis.

Figure 1:
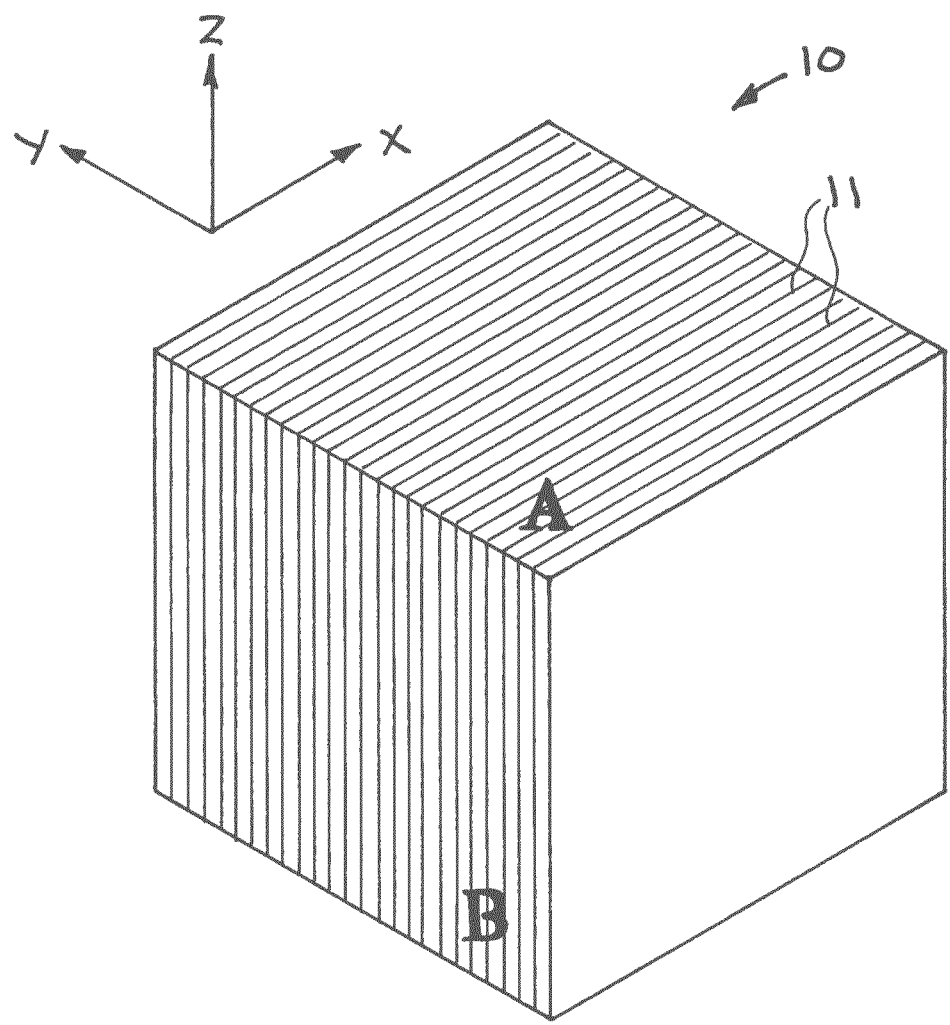
FIG. 1 shows a schematic of a pyrolytic graphite material shown with references axes.
Figure 2:
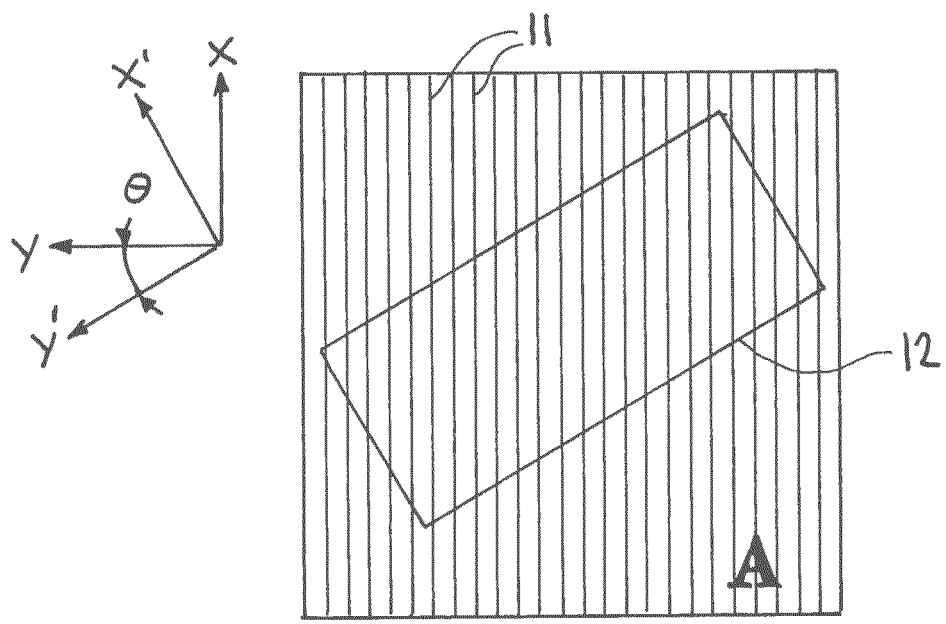
FIG. 2 shows a top view of FIG. 1 and face A, showing a top view of a cutting pattern that is rotated about the Z reference axis for Configuration 1.
Figure 3:
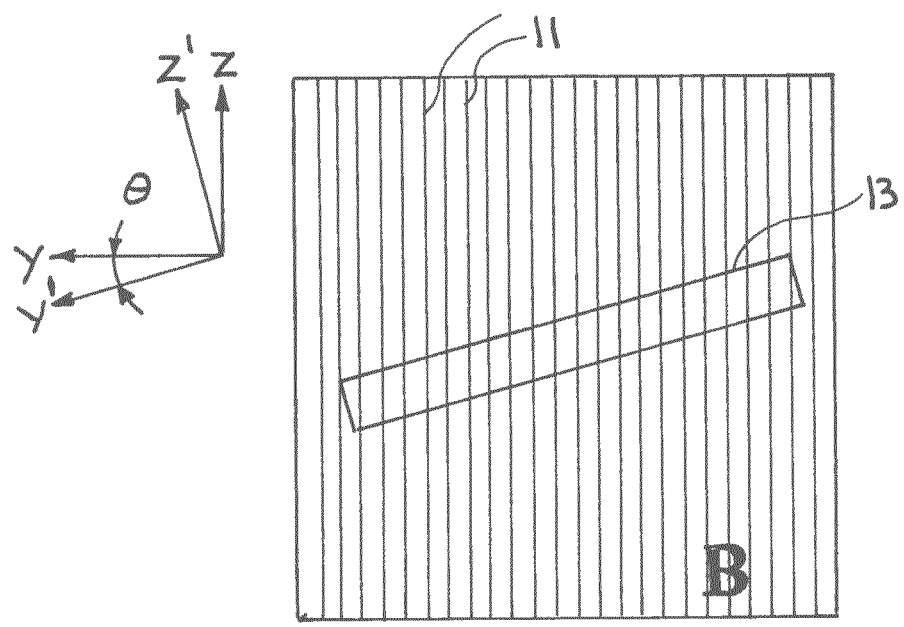
FIG. 3 shows a side view of FIG. 1 and face B, showing a side view of a cutting pattern that is rotated about the X reference axis for Configuration 3.
Figure 10:
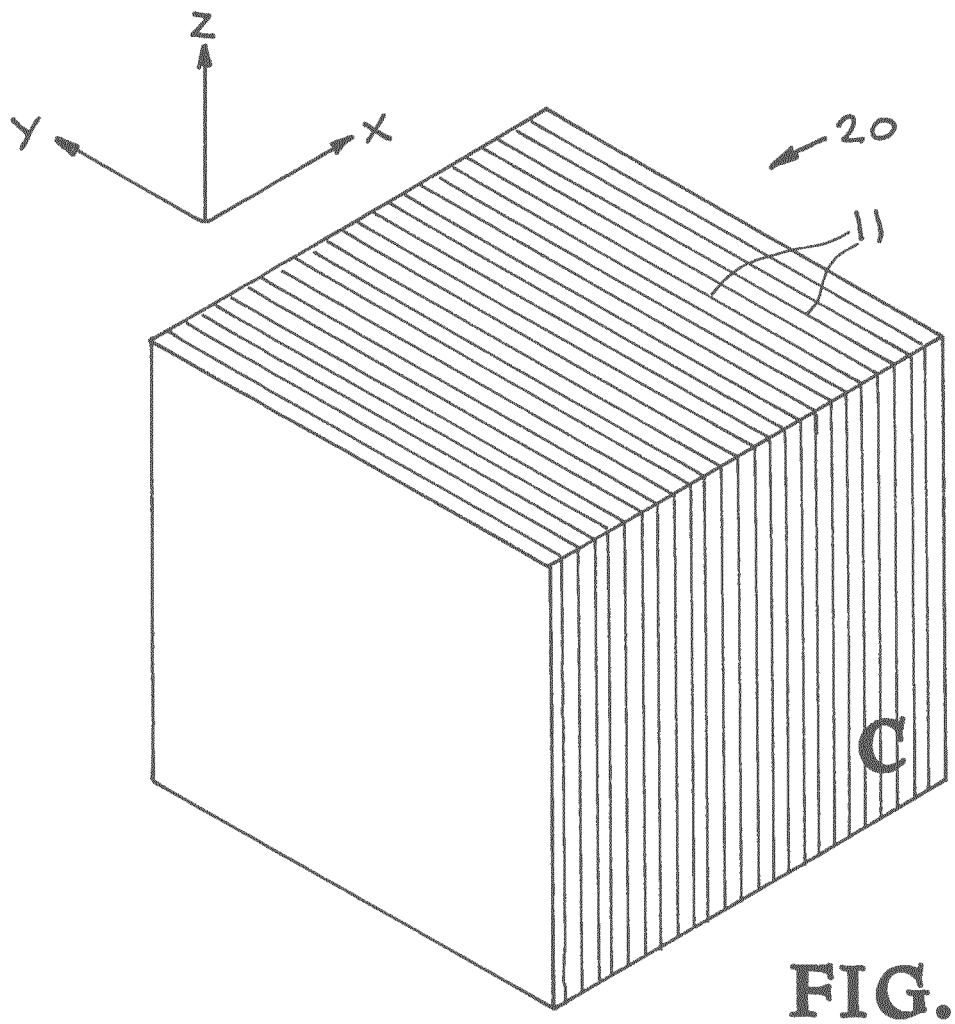
FIG. 10 shows a schematic of a pyrolytic graphite material shown with references axes, and with the basal lines oriented differently than in FIG. 1.
Figure 11:
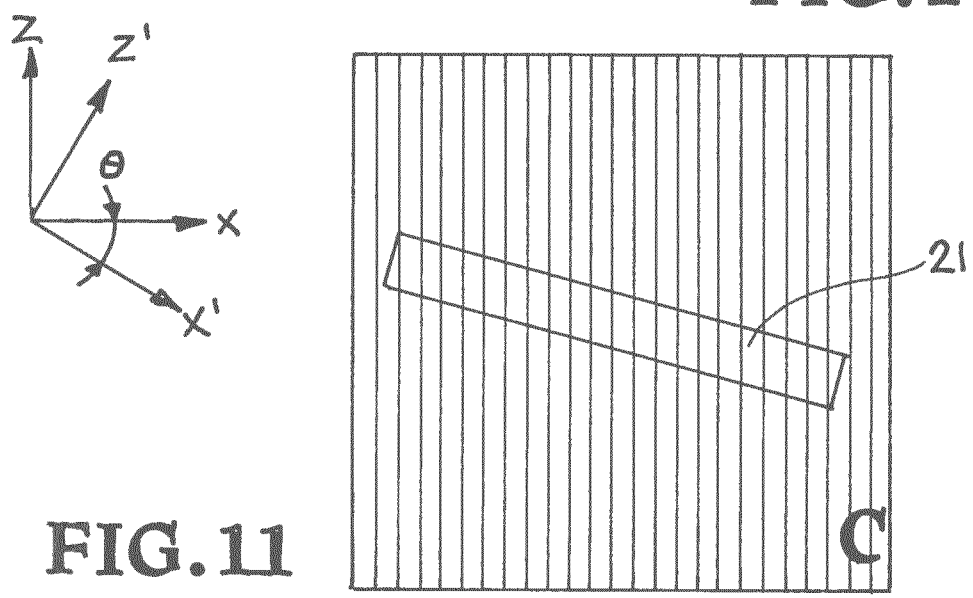
FIG. 11 shows a top view of FIG. 10 and face C, showing a side view of a cutting pattern that is rotated about the Y reference axis for Configuration 2.

The PG substrates for Configurations 1 and 3 may be cut from the PG block 10 oriented as shown in FIG. 1, and the PG substrates for Configuration 2 may be cut from the PG block 20 shown and oriented as shown in FIG. 10. The basal plane of the PG structure is indicated by lines 11, with the principal axis (not shown) orthogonal to the basal plane. FIG. 2 shows a top view of face A of FIG. 1, showing an example cutting/machining pattern 12 that is rotated about the Z reference axis for Configuration 1. While the pattern 12 is shown as a rectangular shape it is appreciated that other shaped patterns may be used. And FIG. 3 shows a side view of FIG. 1 and face B, showing a side view of a cutting pattern 13 that is rotated about the X reference axis for Configuration 3. And FIG. 11 shows a side view of FIG. 10 and face C, showing a side view of a cutting pattern 21 that is rotated about the Y reference axis for Configuration 2.

Figure 5:
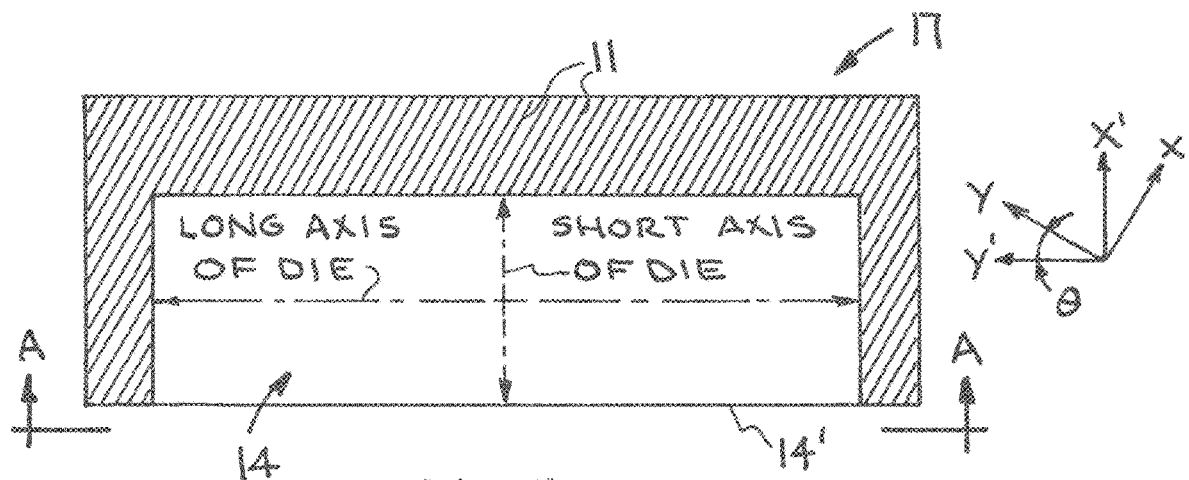
FIG. 5 is a top view of a first embodiment of the laser diode package of the present invention showing a laser diode mounted on a PG substrate having a predetermined orientation angle according to Configuration 1.
Figure 6:
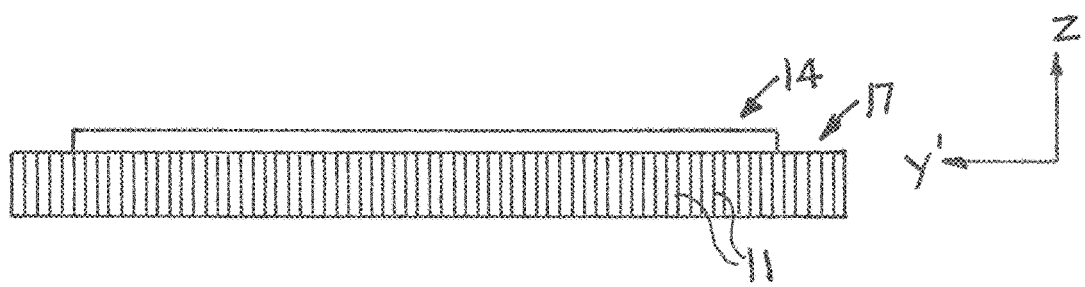
FIG. 6 is a side view of the first embodiment of the laser diode package of FIG. 5 taken along line A-A.

FIG. 5 is a top view of a first embodiment of the laser diode package of the present invention showing a laser diode 14 (with facet side 14') mounted on a PG substrate 17 that has been cut with a predetermined orientation angle according to Configuration 1. The views shown in FIGS. 5 and 6 show the basal plane to be orthogonal with a plane of the mounting surface for the laser diode 14, but is non-orthogonal to the longitudinal axis of the diode die.

Figure 8:
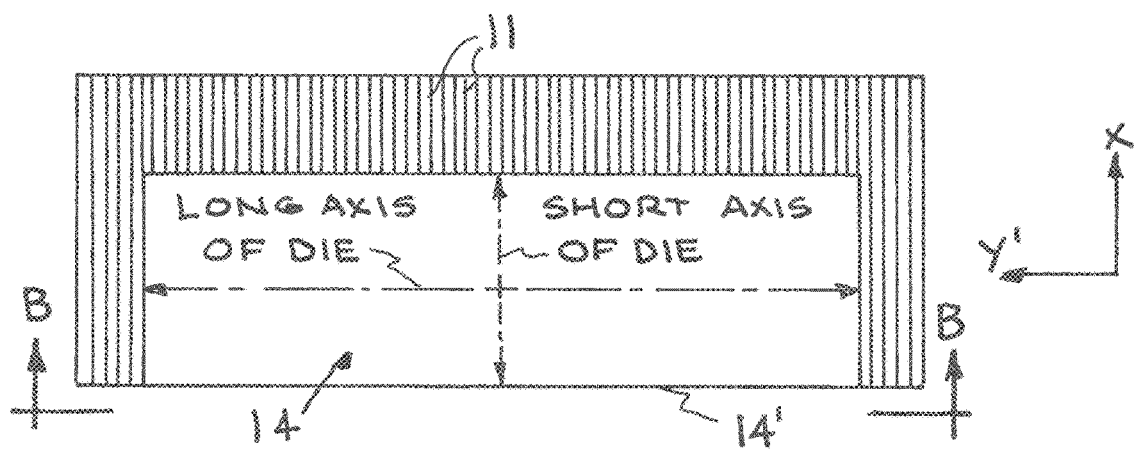
FIG. 8 is a top view of a second embodiment of the laser diode package of the present invention showing a laser diode mounted on a PG substrate having a predetermined orientation angle according to Configuration 3.
Figure 9:
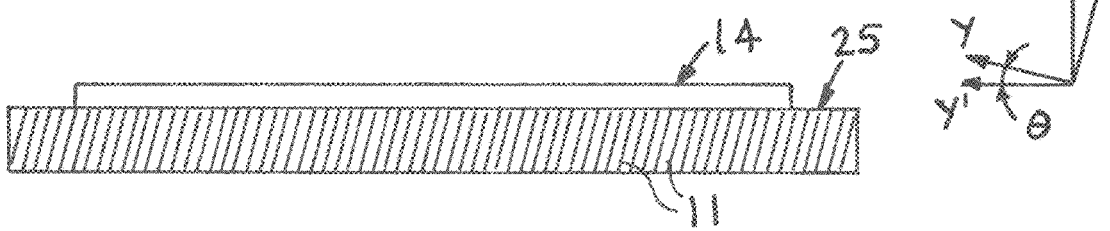
FIG. 9 is a side view of the second embodiment of the laser diode package of FIG. 8 taken along line B-B.

FIG. 8 is a top view of a second embodiment of the laser diode package of the present invention showing a laser diode 14 (with facet side 14') mounted on a PG substrate 25 that has been cut with a predetermined orientation angle according to Configuration 3. The views shown in FIGS. 8 and 9 show the basal plane to be non-orthogonal with a plane of the mounting surface for the laser diode 14, but the intersection of the basal plane (presented by lines 11) and the plane of the mounting surface is substantially orthogonal to the longitudinal axis.

Figure 13:
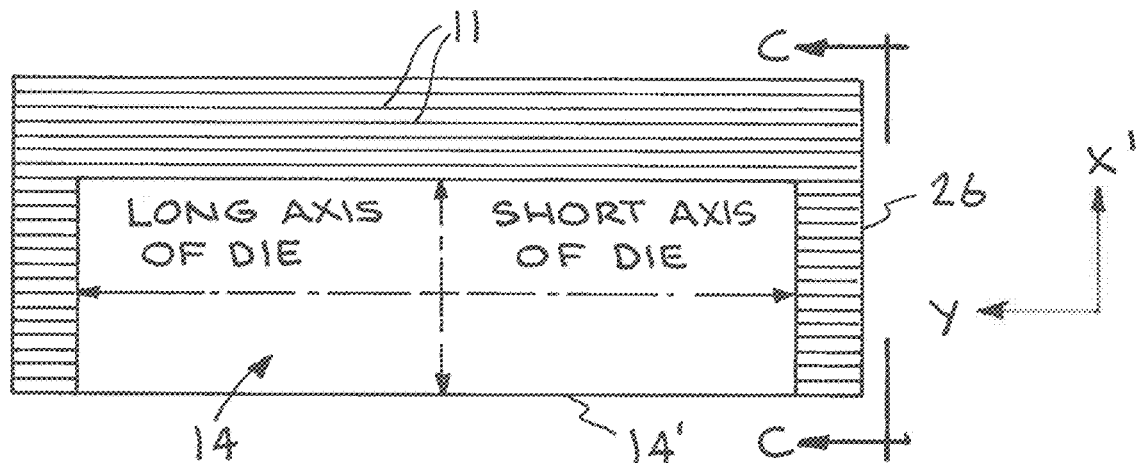
FIG. 13 is a top view of a third embodiment of the laser diode package of the present invention showing a laser diode mounted on a PG substrate having a predetermined orientation angle according to Configuration 2.
Figure 14:
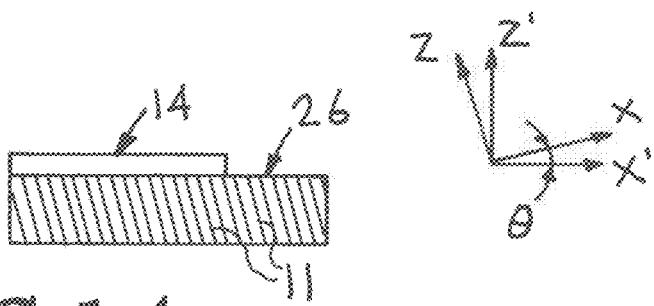
FIG. 14 is a side view of the second embodiment of the laser diode package of FIG. 13 taken along line C-C.
Figure 15A:
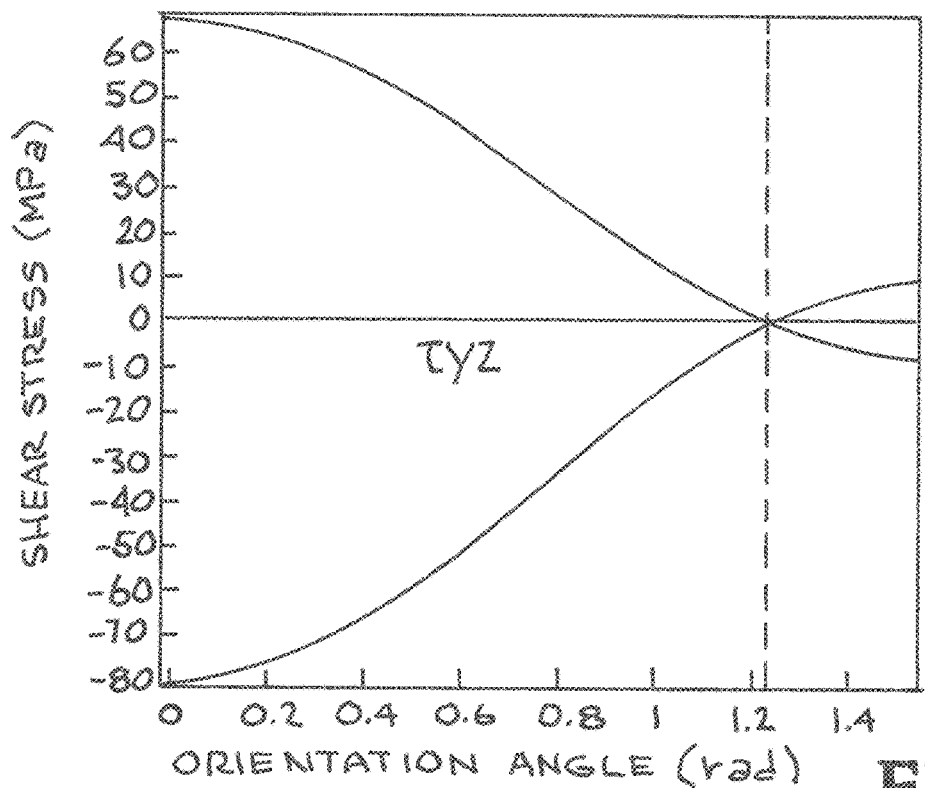
FIG. 15 is a collection of four graphs showing shear stress along the longitudinal and short axes of the laser diode die and temperature distribution, as a function of orientation angle in Configuration 1.
Figure 15B:
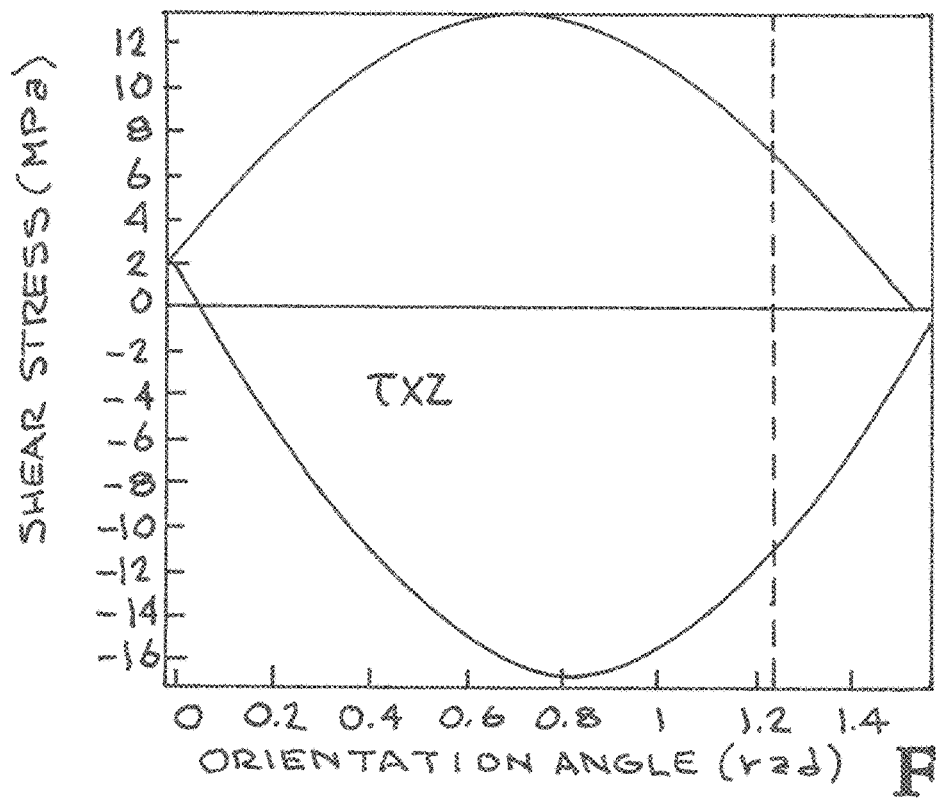
Figure 15C:
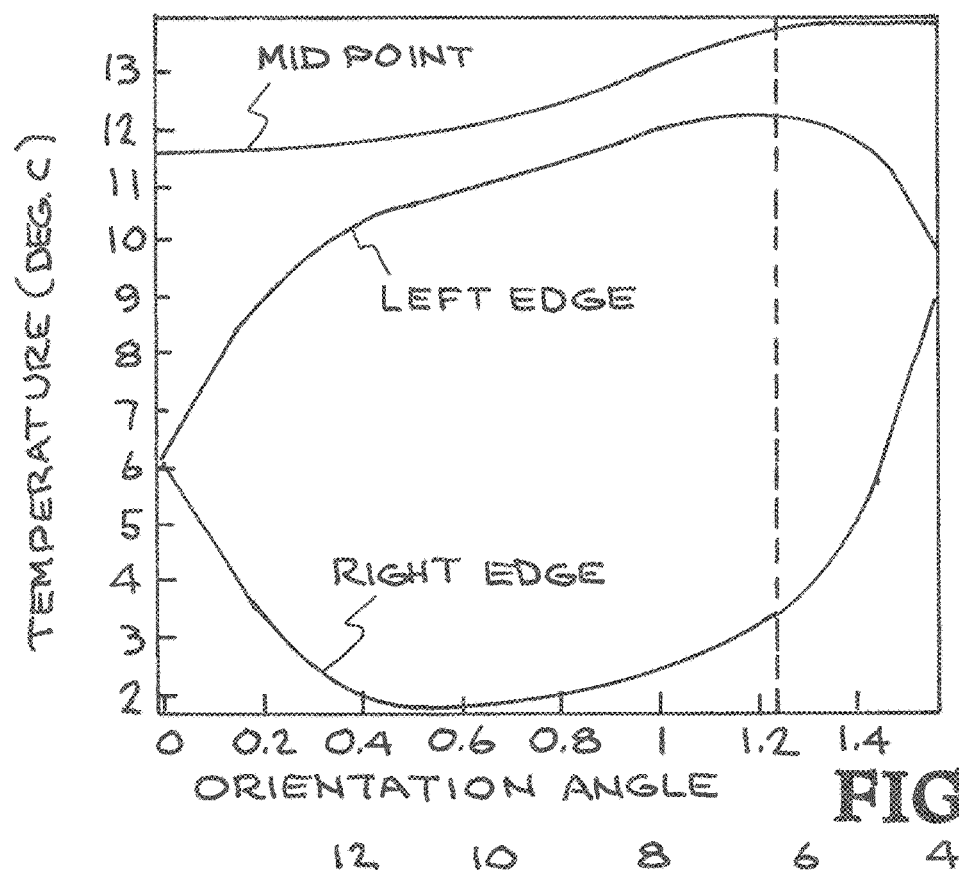
Figure 15D:
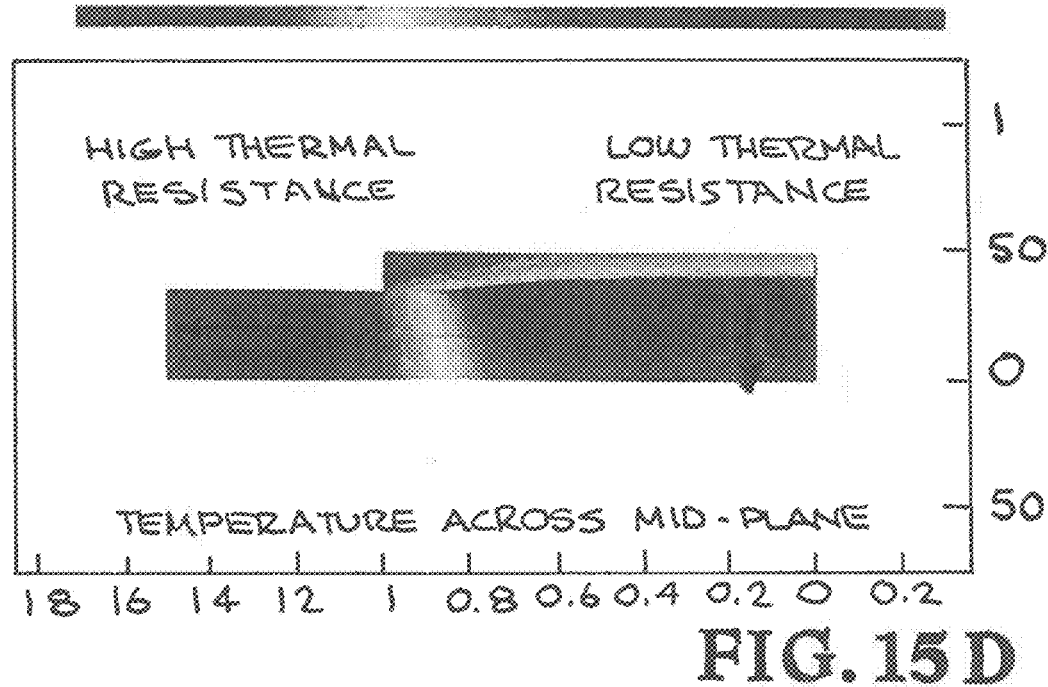
Figure 16A:
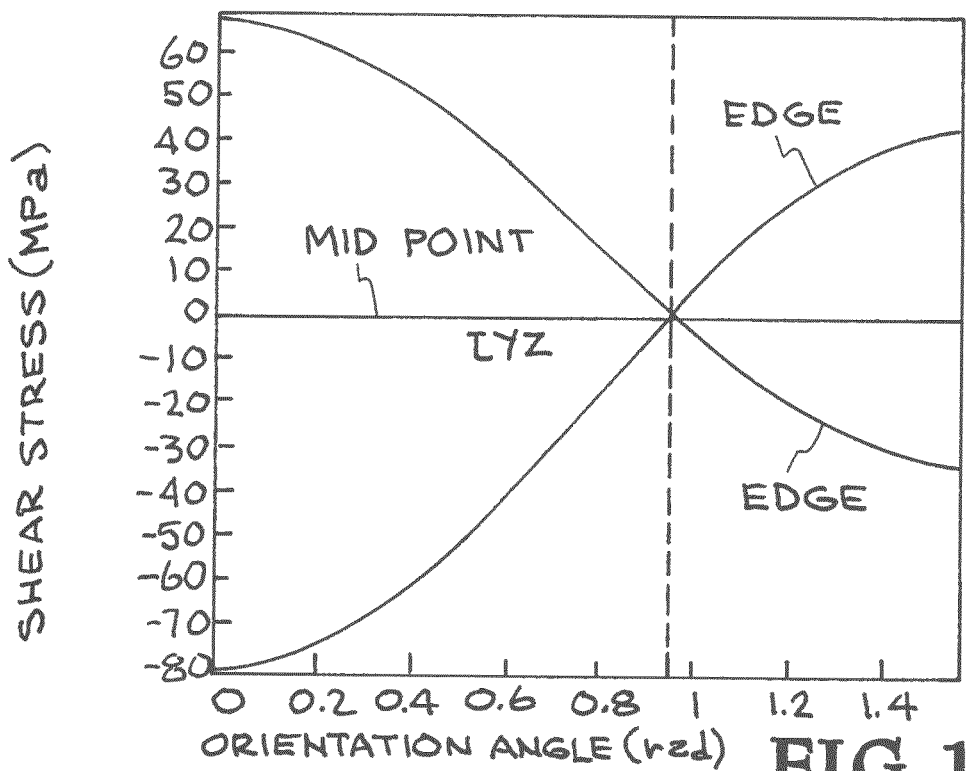
FIG. 16 is a collection of four graphs showing shear stress along the longitudinal and short axes of the laser diode die and temperature distribution, as a function of orientation angle in Configuration 3.
Figure 16B:
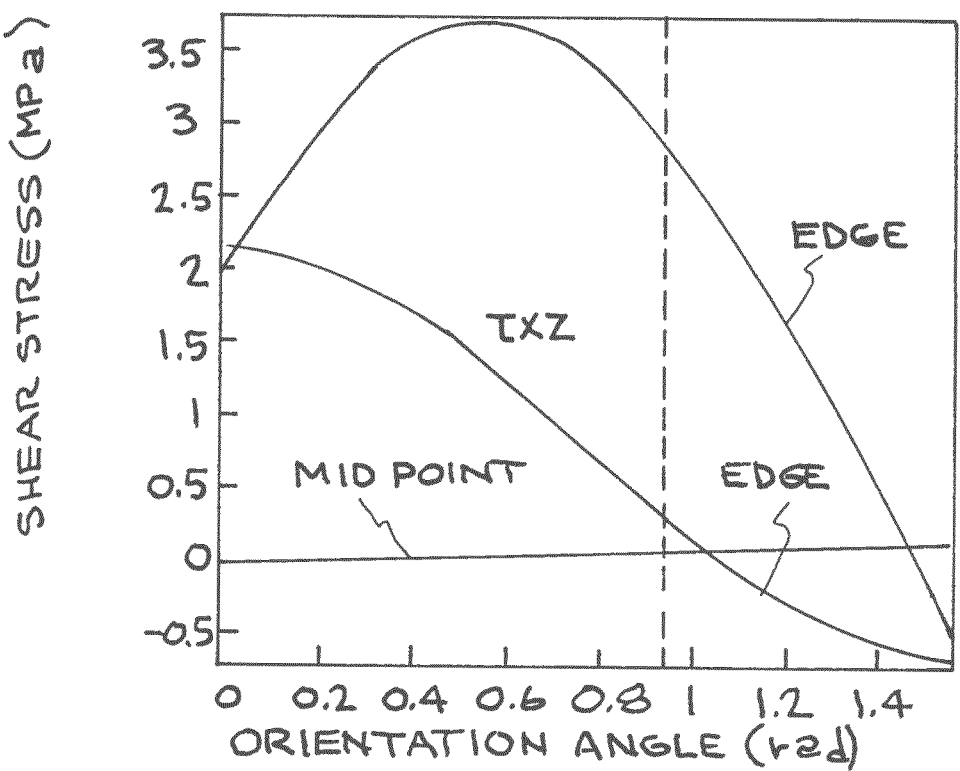
Figure 16C:
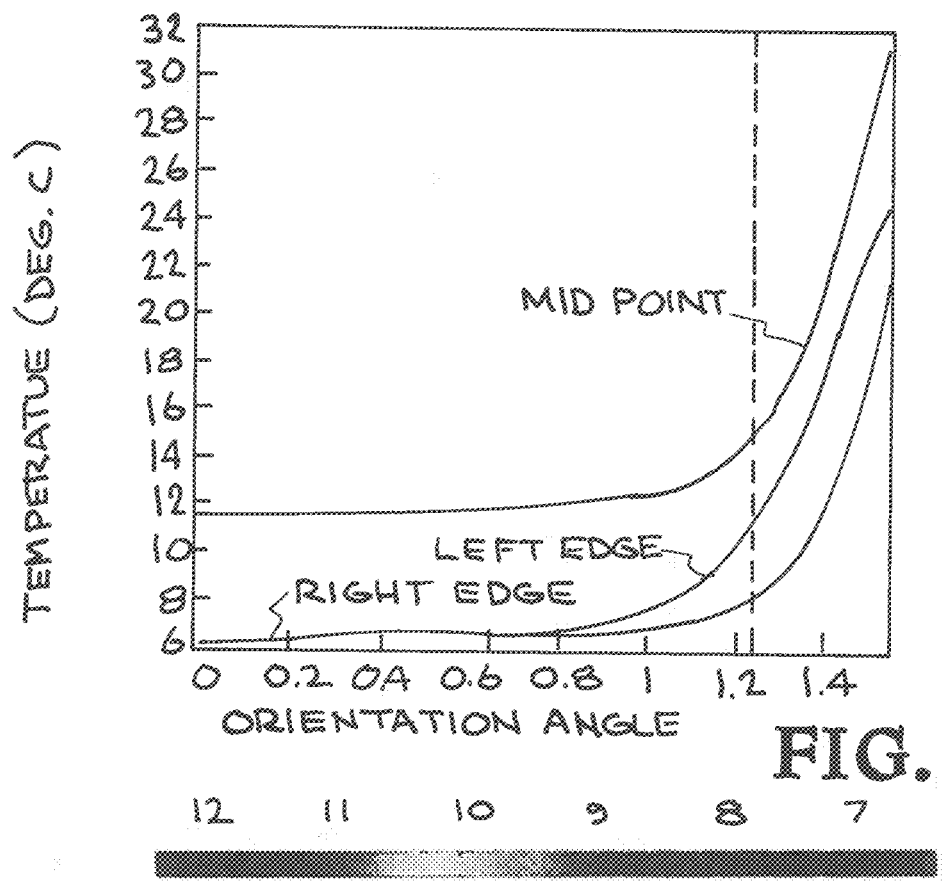
Figure 16D:
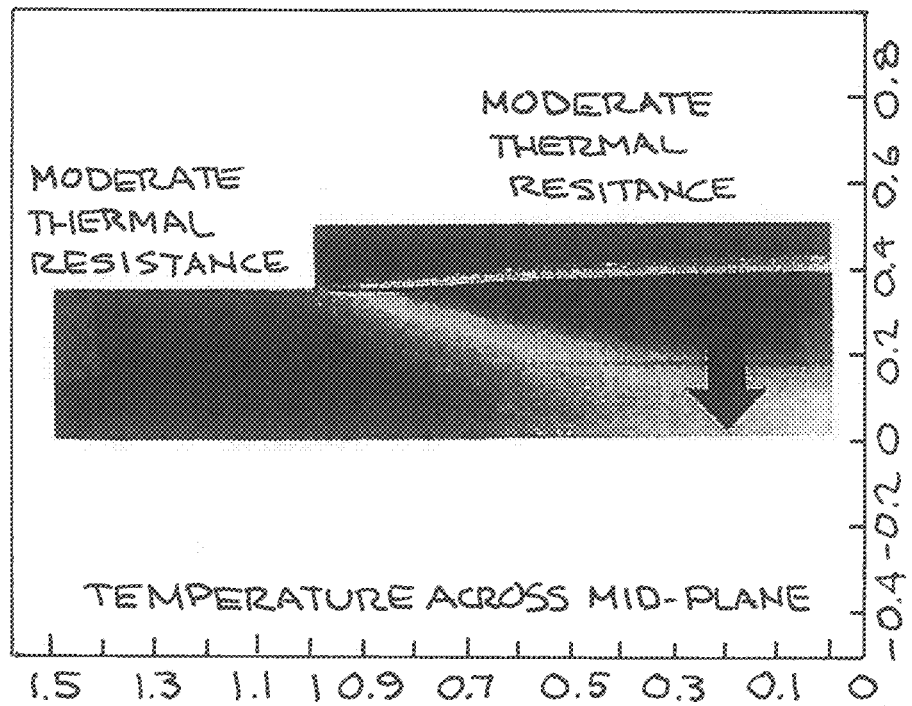
Figure 17A:
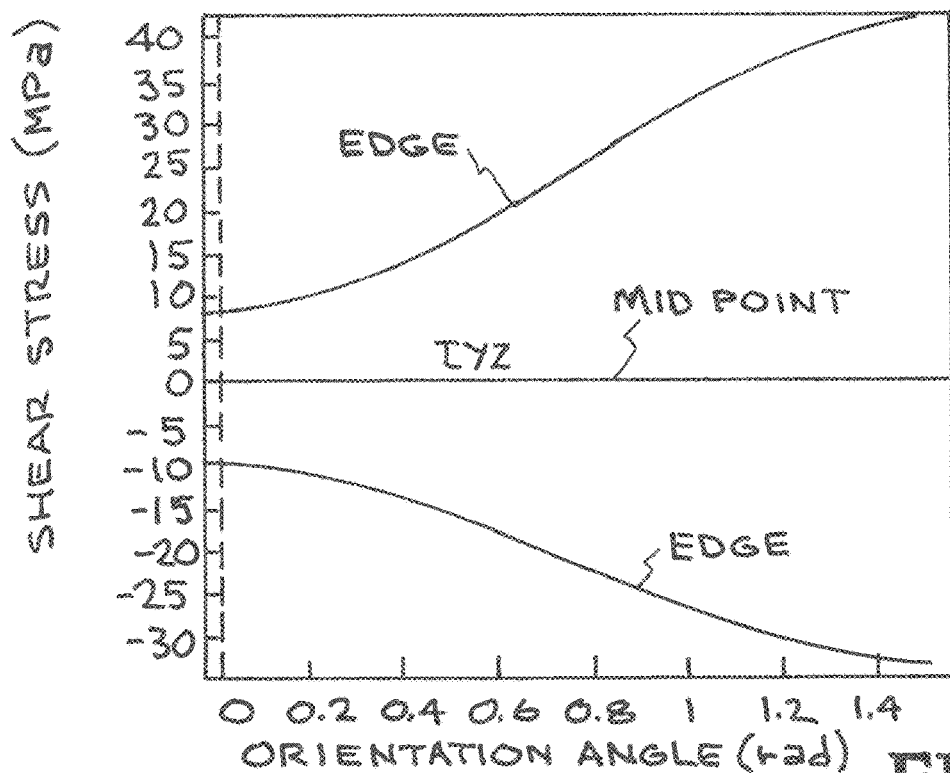
FIG. 17 is a collection of four graphs showing shear stress along the longitudinal and short axes of the laser diode die and temperature distribution, as a function of orientation angle in Configuration 2.
Figure 17B:
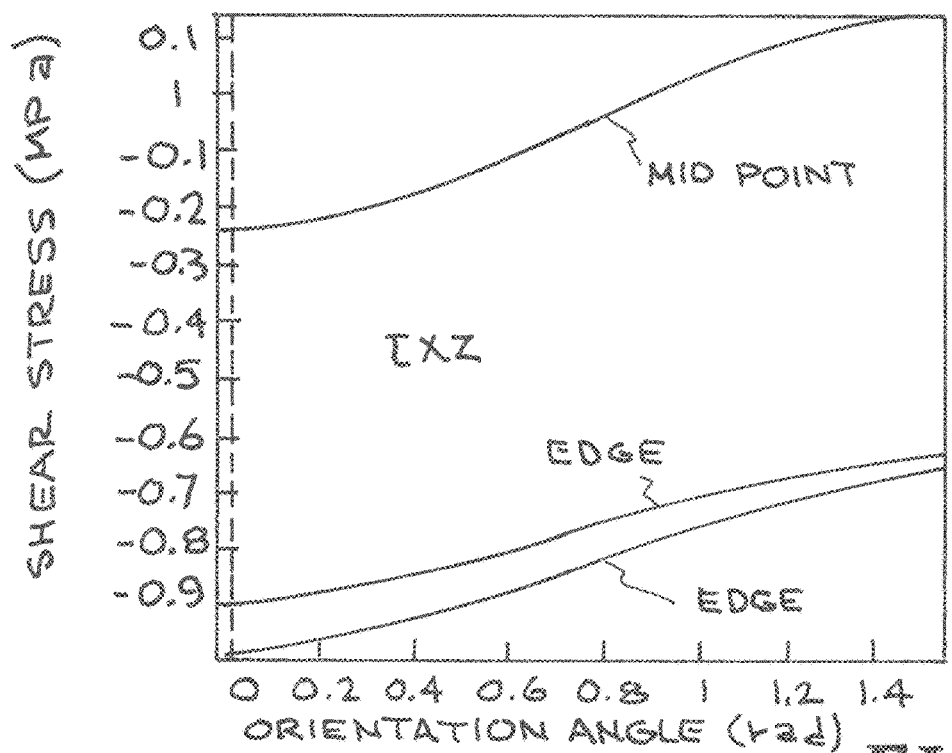
Figure 17C:
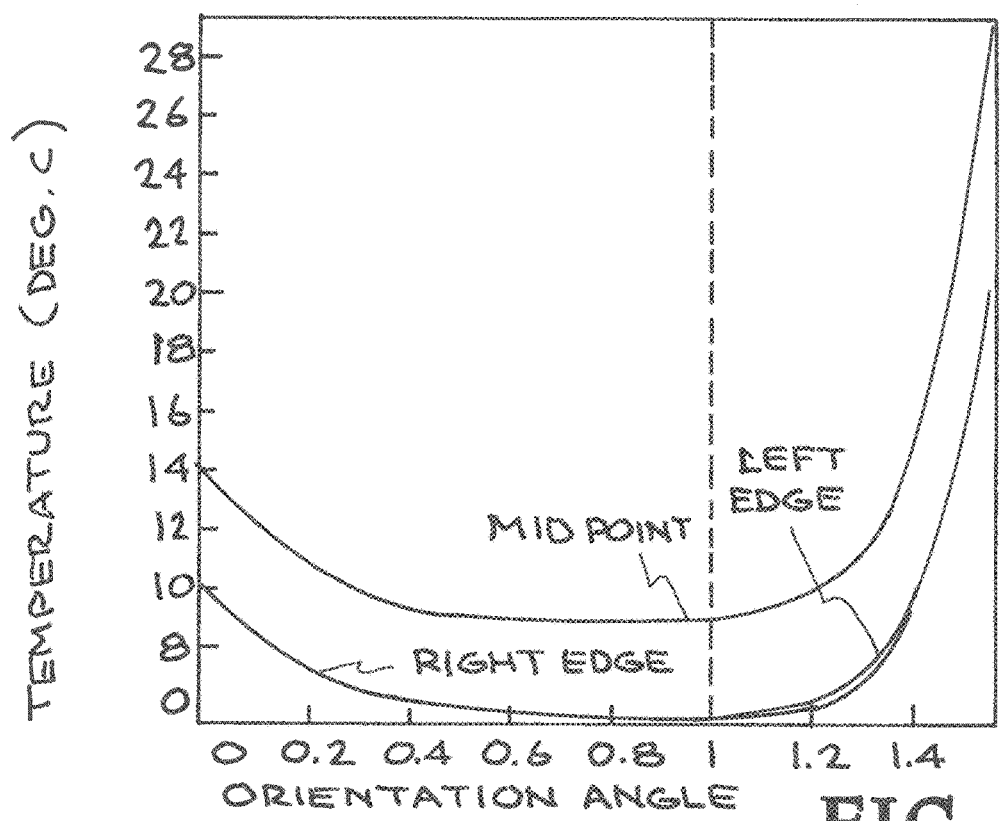
Figure 17D:
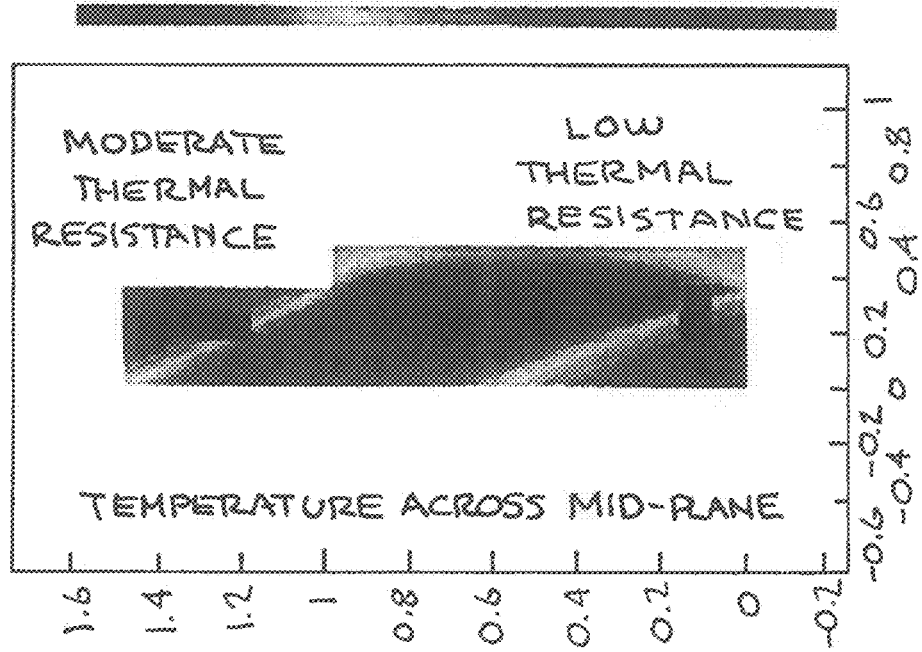

And FIG. 13 is a top view of a third embodiment of the laser diode package of the present invention showing a laser diode 14 (with facet side 14') mounted on a PG substrate 26 that has been cut with a predetermined orientation angle according to Configuration 2. The views shown in FIGS. 13 and 14 show the basal plane to be substantially parallel with the longitudinal axis of the laser diode die, but is substantially non-orthogonal with the plane of the mounting surface.

FIG. 15 is a collection of four graphs showing shear stress along the longitudinal and short axes of the laser diode die and temperature distribution, as a function of orientation angle in Configuration 1. Graph (A) shows in particular the shear stress along a longitudinal axis of a laser diode die as a function of orientation angle, graph (B) shows the same thing but along the short axis of the laser diode die, graph (C) shows the temperature as a function of orientation angle, and shows non-uniform temperature distribution along the long axis of the die, and graph (D) shows temperatures across a mid-plane cross-section of the laser diode package. The tuning is simulated under thermal loading representing AuSn solidification. The stress free temperature is assumed to be 278° C. and the shear stress is evaluated at room temperature. The goal of the analysis was to seek the appropriate orientation for a given configuration where the shear stress in the longest direction of the laser diode is close to zero. FIG. 15 shows shear stress distribution as a function of the orientation angle for Configuration 1. As can be seen in the analysis, the minimum shear stress for the long direction is achieved at 1.25 rad. (Note this may be alternative characterized as the basal plane having a orientation angle that is about 2.82 radians from the longitudinal axis, calculated as 1.25+2π/2 radians. The corresponding temperature measured at the facet edge is shown also as a function of the orientation angle.

FIG. 16 is a collection of four graphs similar to FIG. 15 showing shear stress along the longitudinal and short axes of the laser diode die and temperature distribution, as a function of orientation angle in Configuration 3. Graph (A) shows in particular the shear stress along a longitudinal axis of a laser diode die as a function of orientation angle, graph (B) shows the same thing but along the short axis of the laser diode die, graph (C) shows the temperature as a function of orientation angle, and shows non-uniform temperature distribution along the long axis of the die, and graph (D) shows temperatures across a mid-plane cross-section of the laser diode package. The tuning is again simulated under thermal loading representing AuSn solidification. The stress free temperature is assumed to be 278° C. and the shear stress is evaluated at room temperature. The goal of the analysis was to seek the appropriate orientation for a given configuration where the shear stress in the longest direction of the laser diode is close to zero. FIG. 16 shows shear stress distribution as a function of the orientation angle for Configuration 3. As can be seen in the analysis, the minimum shear stress for the long direction is achieved at 0.95 rad. (Note this may be alternative characterized as the basal plane having a orientation angle that is about 2.52 radians from the longitudinal axis, calculated as 0.95+π/2 radians. The corresponding temperature measured at the facet edge is shown also as a function of the orientation angle.

And FIG. 17 is a collection of four graphs similar to FIGS. 15 and 16 showing shear stress along the longitudinal and short axes of the laser diode die and temperature distribution, as a function of orientation angle in Configuration. The same analysis as for Configurations 1 and 3 is also repeated for Configuration 2. Graph (A) shows in particular the shear stress along a longitudinal axis of a laser diode die as a function of orientation angle, graph (B) shows the same thing but along the short axis of the laser diode die, graph (C) shows the temperature as a function of orientation angle, and shows non-uniform temperature distribution along the long axis of the die, and graph (D) shows temperatures across a mid-plane cross-section of the laser diode package. The tuning is again simulated under thermal loading representing AuSn solidification. The stress free temperature is assumed to be 278° C. and the shear stress is evaluated at room temperature. The goal of the analysis was to seek the appropriate orientation for a given configuration where the shear stress in the longest direction of the laser diode is close to zero. FIG. 17 shows shear stress distribution as a function of the orientation angle for Configuration 2. In Configuration 2, the shear stress never went to zero for any orientation angle. So orientation 2 is not particularly suitable for CTE tuning. However from thermal point of view, the orientation 2 ensures that the facet temperature can be less then the core temperature. This may be helpful to reduce catastrophic optical damage COD loss in edge emitting laser during operation.

Figure 18:
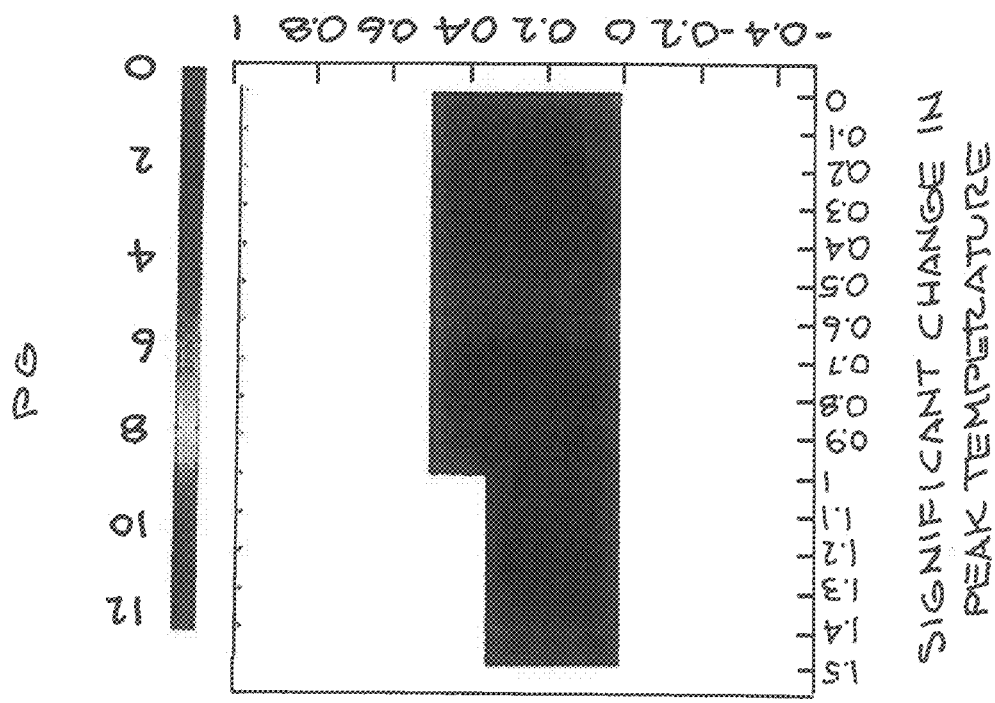
FIG. 18 shows the thermal profile of a single laser diode package of the present invention, compared to the thermal profile of a CuW laser diode package known in the art.
Figure 18:
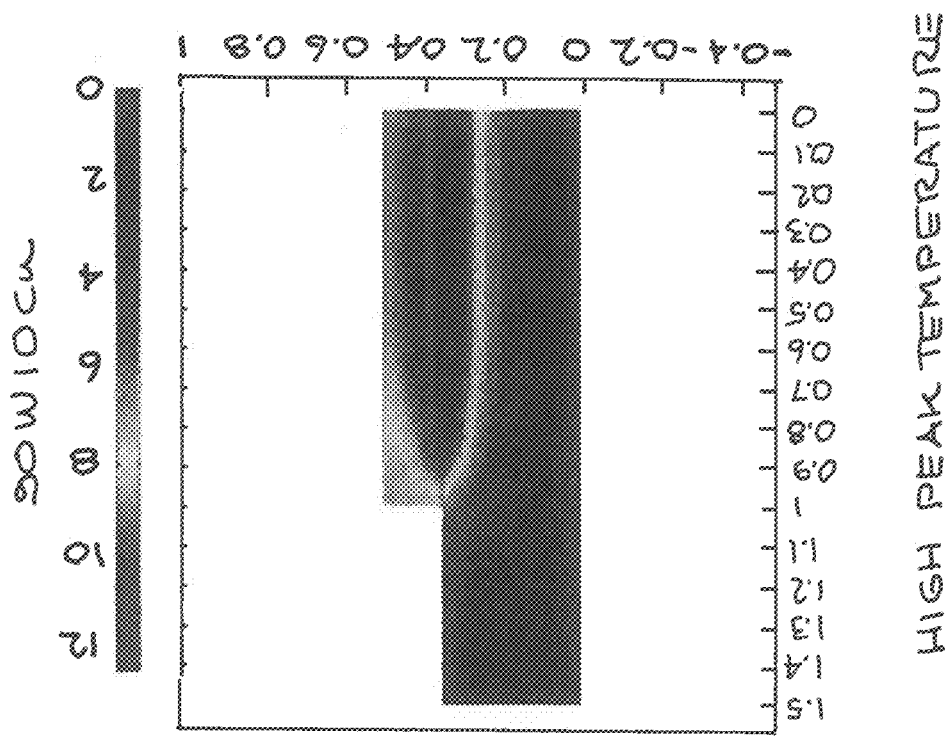
Figure 23:
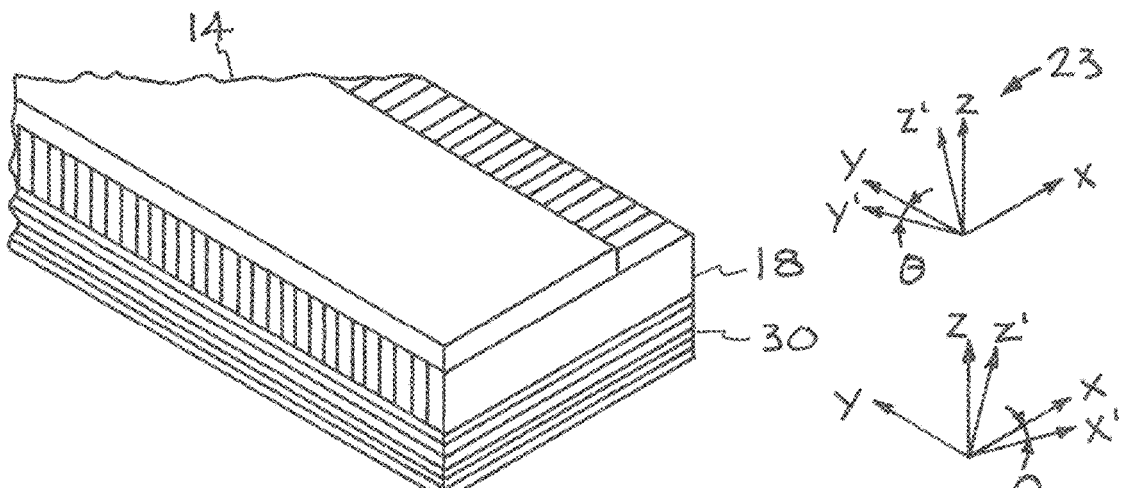
FIG. 23 is a perspective view of one end of a schematic laser diode package arranged as Configuration 5, showing a long axis of the laser diode arranged approximately orthogonal to basal plane of a first PG substrate (arranged as Configuration 3) before being angled to a pre-determined orientation angle, and also having a second PG substrate having basal plane substantially parallel to a die mounting surface and also before being angled to a pre-determined orientation angle.

FIG. 18 shows the thermal profile of a single laser diode package of the present invention, compared to the thermal profile of a CuW laser diode package known in the art. As can be seen in FIG. 18, the thermal property of PG works well in a single device and can be a problem due to thermal cross talk if arranged in a stack. Therefore, there is a need to create a multilayer stack configuration using PG substrates to reduce thermal cross talk. The two Configurations 4 and 5 shown in FIGS. 19 and 23 are intended for this purpose.

Figure 19:
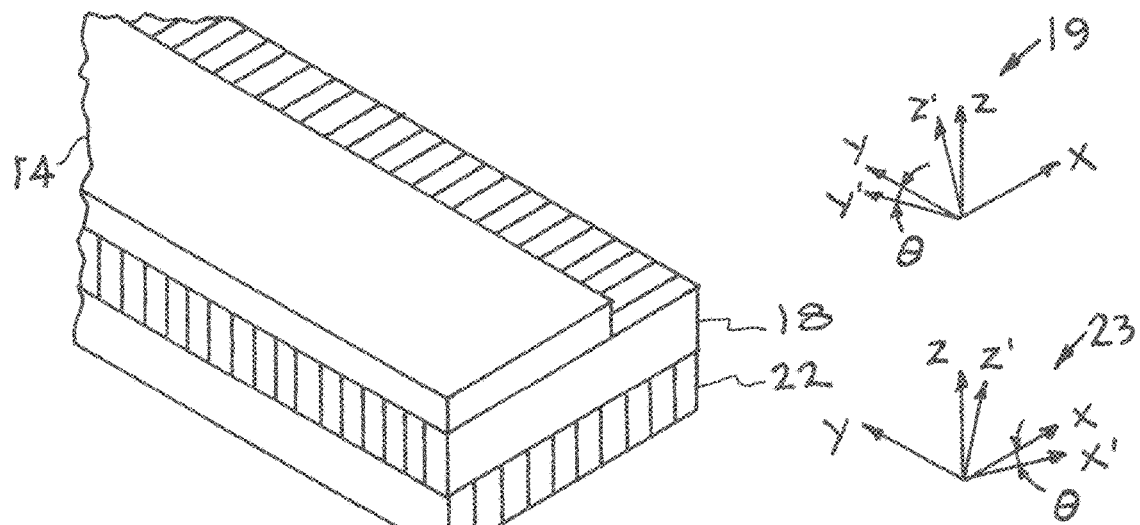
FIG. 19 is a perspective view of one end of a schematic laser diode package arranged as Configuration 4, showing a long axis of the laser diode arranged approximately orthogonal to basal plane of a first PG substrate (arranged as Configuration 3) before being angled to a pre-determined orientation angle, and also having a second PG substrate (arranged as Configuration 2) also before being angled to a pre-determined orientation angle.

FIG. 19 is a perspective view of one end of a schematic laser diode package arranged as Configuration 4, showing a long axis of the laser diode arranged approximately orthogonal to basal plane of a first PG substrate (arranged as Configuration 3) before being angled to a pre-determined orientation angle, and also having a second PG substrate (arranged as Configuration 2) also before being angled to a pre-determined orientation angle.

Similar to Configurations 1, 3, and 2, the PG substrate 18 of Configuration 4 in FIG. 19 is shown with cross hatching lines indicating the basal plane of the graphite structure where thermal conductivity is high within the plane, but low normal to the basal plane. The PG substrate 18 also has attached and mounted on a top mounting surface a laser diode die 14 arranged so that its longitudinal axis is substantially orthogonal to the basal plane. Furthermore, the PG substrate 18 is shown with orientation angle θ=0. However, the reference axes 19 and 23 indicates that θ for the first substrate is rotated about the X reference axis, and $θ_1$ for the second substrate is rotated about the Y reference axis. The first PG substrate 18 for Configuration 4 may be cut from the PG block 10 oriented as shown in FIG. 1 to produce a Configuration 3 substrate, and the second PG substrate for Configuration 4 may be cut from the PG block 20 shown and oriented as shown in FIG. 10 to produce a Configuration 2 substrate.

Figure 20:
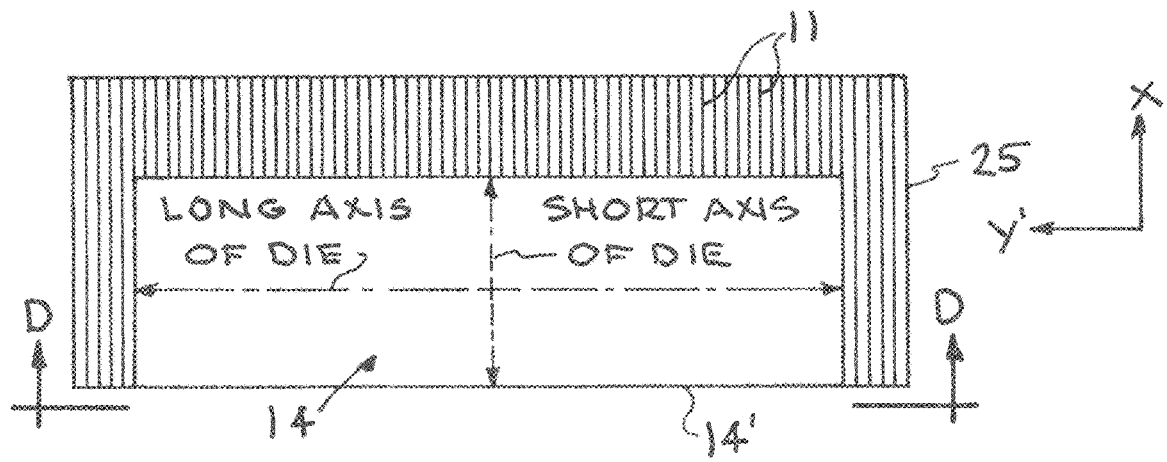
FIG. 20 is a top view of a fourth embodiment of the laser diode package of the present invention showing a laser diode mounted on a PG substrate having a predetermined orientation angle according to Configuration 4.
Figure 21:
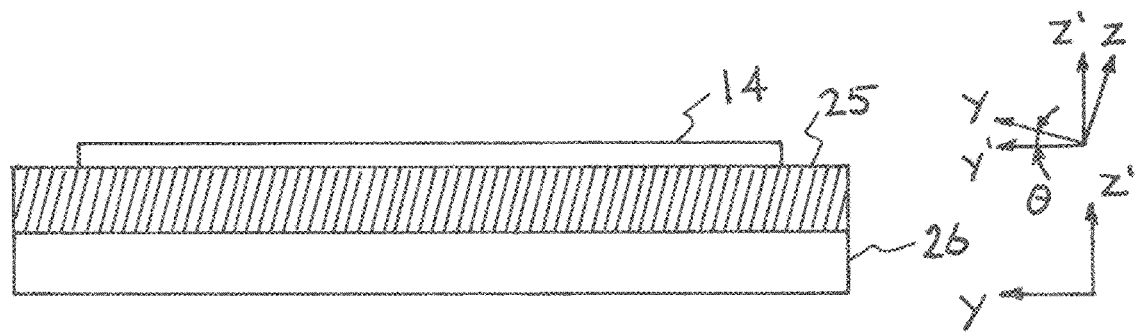
FIG. 21 is a side view of the fourth embodiment of the laser diode package of FIG. 20 taken along line D-D.
Figure 22A:
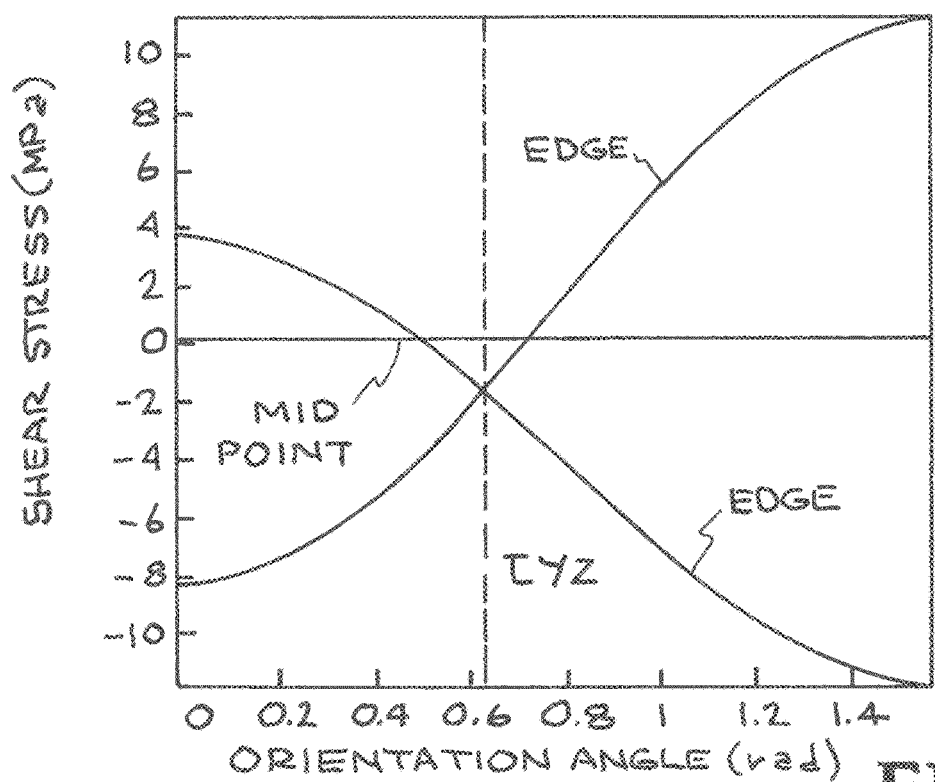
FIG. 22 is a collection of four graphs showing shear stress along the longitudinal and short axes of the laser diode die and temperature distribution, as a function of orientation angle in Configuration 4.
Figure 22B:
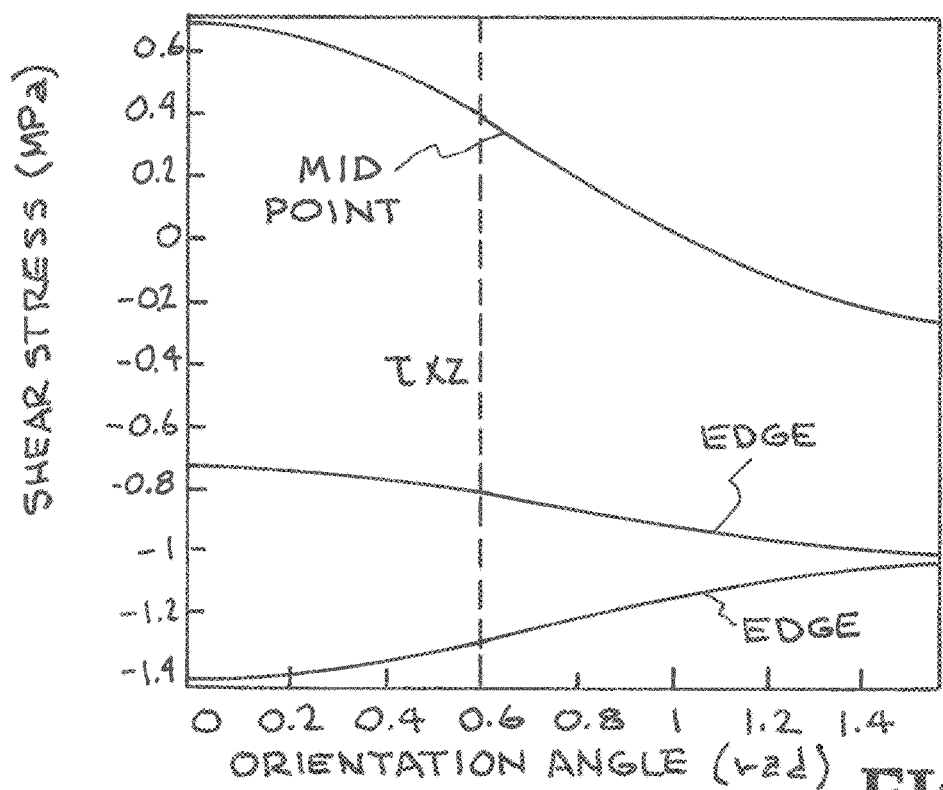
Figure 22C:
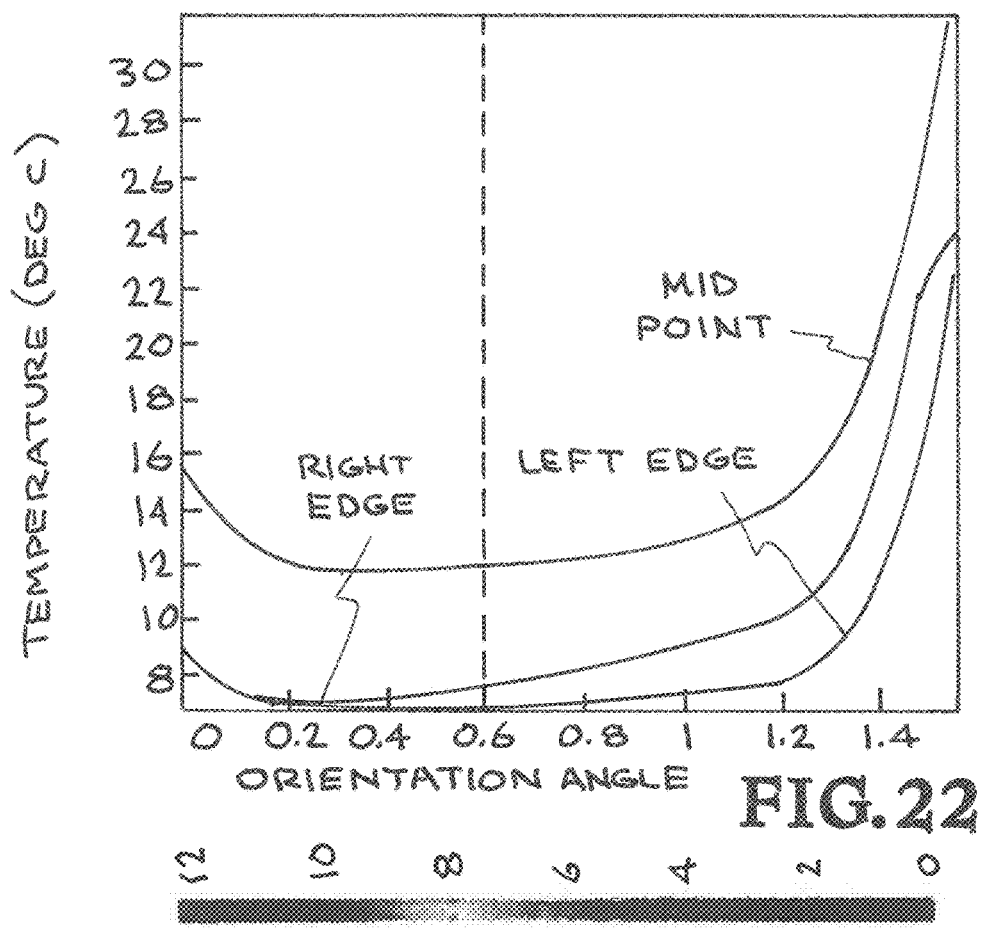
Figure 22D:
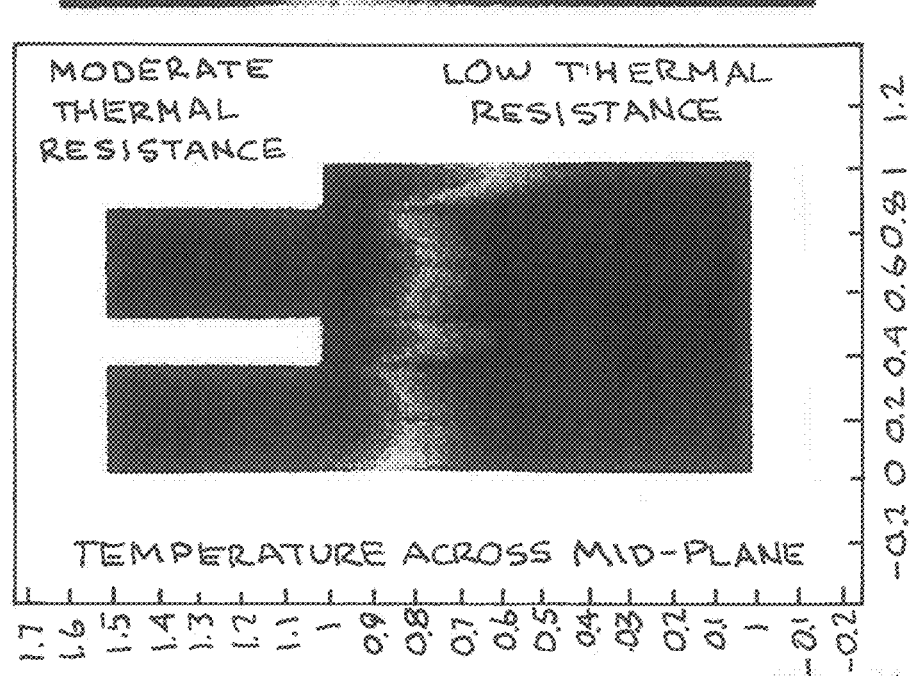

FIG. 19 is a top view of a fourth embodiment of the laser diode package of the present invention showing a laser diode 14 (with facet side 14') mounted on a PG substrate 25 that has been cut with a predetermined orientation angle according to Configuration 4. The views shown in FIGS. 20 and 21 show the basal plane of the first substrate to be non-orthogonal with a plane of the mounting surface for the laser diode 14, but the intersection with the plane of the mounting surface is orthogonal to the longitudinal axis of the diode die. And the basal plane of the second substrate may be substantially parallel with the longitudinal axis of the laser diode die.

Similar to FIGS. 15-17, FIG. 22 is a collection of four graphs showing shear stress along the longitudinal and short axes of the laser diode die and temperature distribution, as a function of orientation angle. Graph (A) shows in particular the shear stress along a longitudinal axis of a laser diode die as a function of orientation angle, graph (B) shows the same thing but along the short axis of the laser diode die, graph (C) shows the temperature as a function of orientation angle of the first substrate, and shows non-uniform temperature distribution along the long axis of the die, and graph (D) shows temperatures across a mid-plane cross-section of the laser diode package. The tuning is again simulated under thermal loading representing AuSn solidification. The stress free temperature is assumed to be 278° C. and the shear stress is evaluated at room temperature. FIG. 22 shows shear stress distribution as a function of the orientation angle for Configuration 4. The corresponding temperature measured at the facet edge is shown also as a function of the orientation angle.

Similar to Configurations 1, 3, 2, and 4 the upper and lower PG substrates 18 and 30 respectively of Configuration 5 in FIG. 23 is shown with cross hatching lines indicating the basal plane of the graphite structure where thermal conductivity is high within the plane, but low normal to the basal plane. The first PG substrate 18 also has attached and mounted on a top mounting surface a laser diode die 14 arranged so that its longitudinal axis is substantially orthogonal to the basal plane. Furthermore, the PG substrate 18 is shown with orientation angle θ=0. However, the reference axes 23 and 31 indicates that θ for the first substrate is rotated about the X reference axis, and $θ_1$ for the second substrate is rotated about the Y reference axis. The first PG substrate 18 for Configuration 5 may be cut from the PG block 10 oriented as shown in FIG. 1 to produce a Configuration 3 substrate, and the second PG substrate for Configuration 5 may be cut from the PG block 20 shown and oriented as shown in FIG. 10 to produce a configuration having the basal plane substantially parallel with the plane of the mounting surface.

Figure 24:
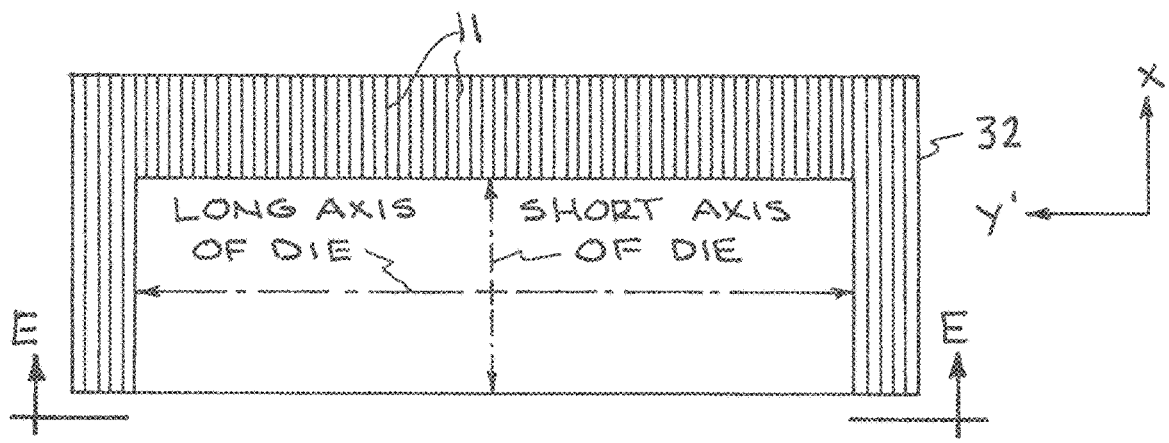
FIG. 24 is a top view of a fifth embodiment of the laser diode package of the present invention showing a laser diode mounted on a PG substrate having a predetermined orientation angle according to Configuration 5.
Figure 25:
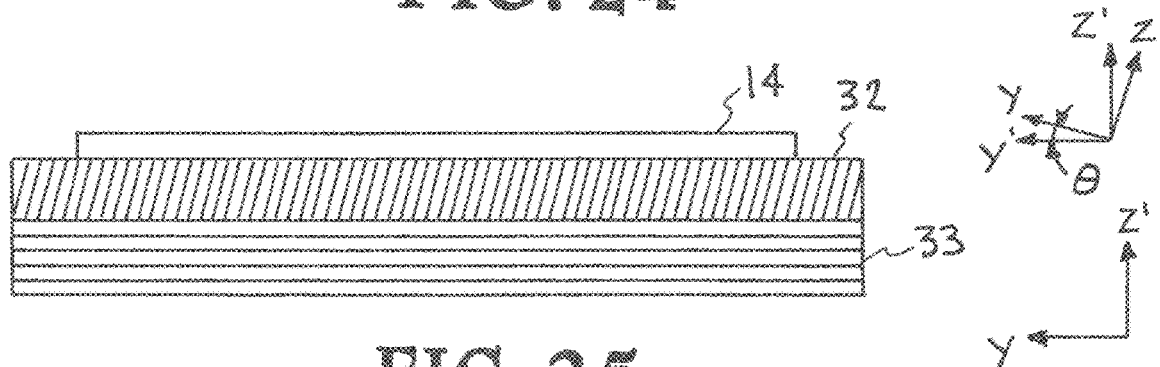
FIG. 25 is a side view of the fourth embodiment of the laser diode package of FIG. 24 taken along line E-E.
Figure 26A:
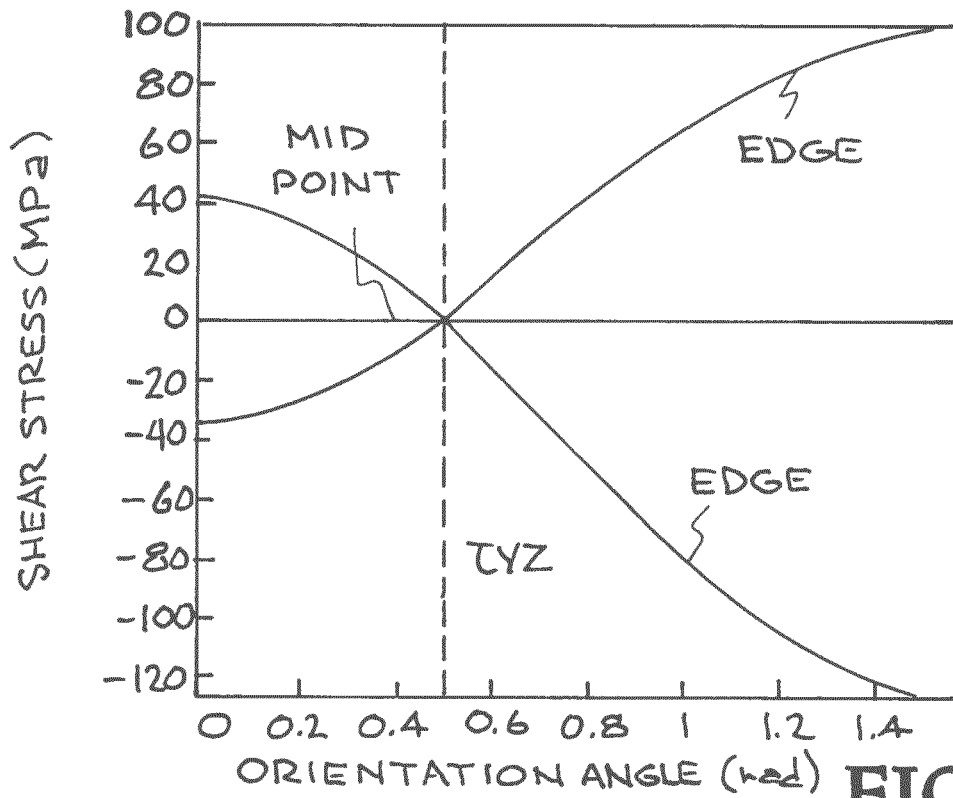
FIG. 26 is a collection of four graphs showing shear stress along the longitudinal and short axes of the laser diode die and temperature distribution, as a function of orientation angle in Configuration 5.
Figure 26B:
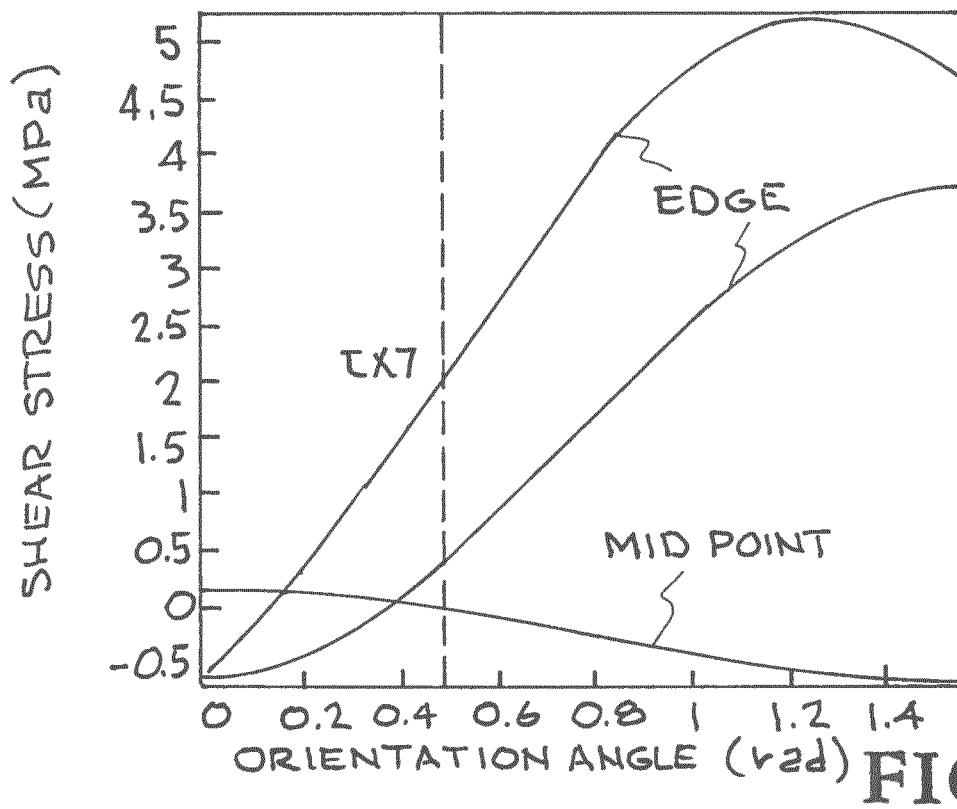
Figure 26C:
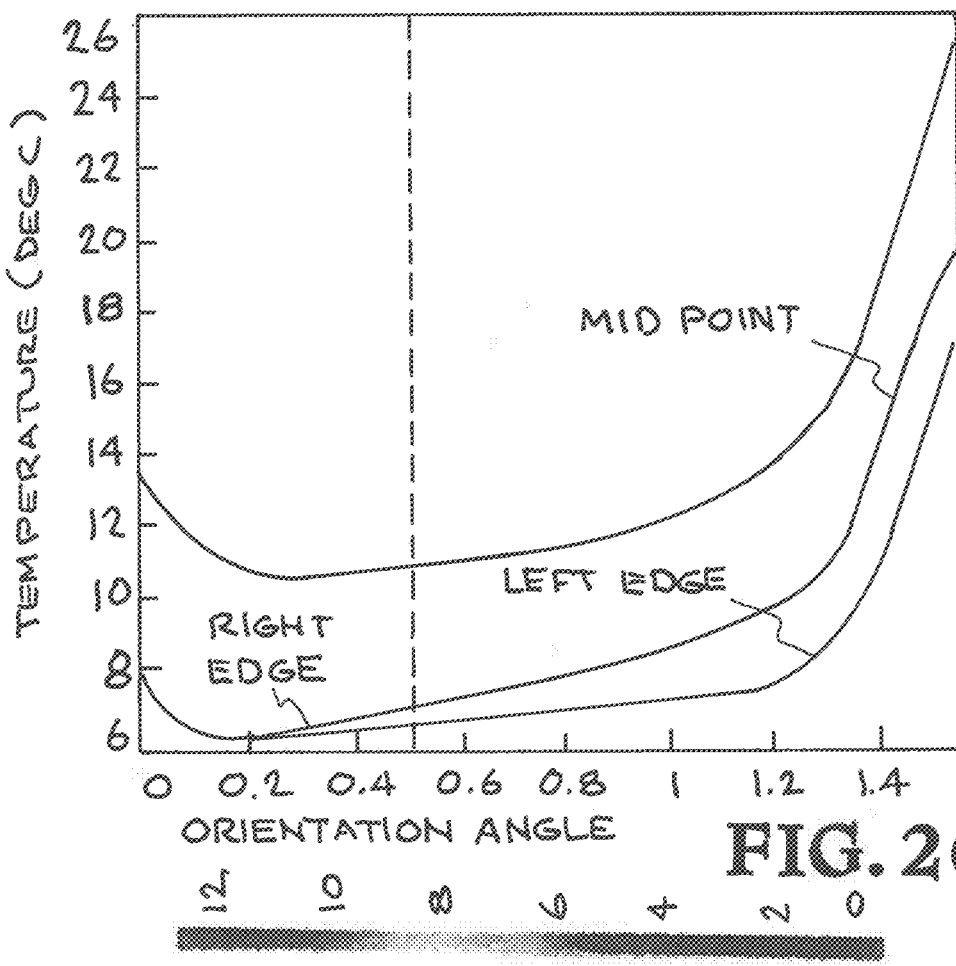
Figure 26D:
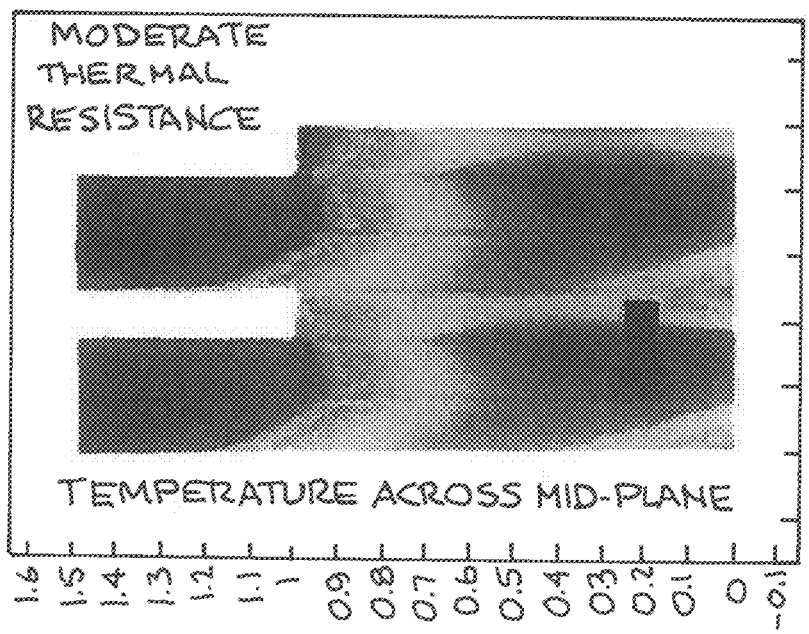

FIG. 24 is a top view of a fifth embodiment of the laser diode package of the present invention showing a laser diode 14 (with facet side 14') mounted on a PG substrate 32 that has been cut with a predetermined orientation angle according to Configuration 5. The views shown in FIGS. 24 and 25 show the basal plane of the first substrate to be non-orthogonal with a plane of the mounting surface for the laser diode 14, but the intersection with the plane of the mounting surface is orthogonal to the longitudinal axis of the diode die.

Similar to FIG. 22, FIG. 26 is a collection of four graphs showing shear stress along the longitudinal and short axes of the laser diode die and temperature distribution, as a function of orientation angle, for Configuration 5. Graph (A) shows in particular the shear stress along a longitudinal axis of a laser diode die as a function of orientation angle, graph (B) shows the same thing but along the short axis of the laser diode die, graph (C) shows the temperature as a function of orientation angle of the first substrate, and shows non-uniform temperature distribution along the long axis of the die, and graph (D) shows temperatures across a mid-plane cross-section of the laser diode package. The tuning is again simulated under thermal loading representing AuSn solidification. The stress free temperature is assumed to be 278° C. and the shear stress is evaluated at room temperature. FIG. 26 shows shear stress distribution as a function of the orientation angle for Configuration 5. The corresponding temperature measured at the facet edge is shown also as a function of the orientation angle.

Figure 27:
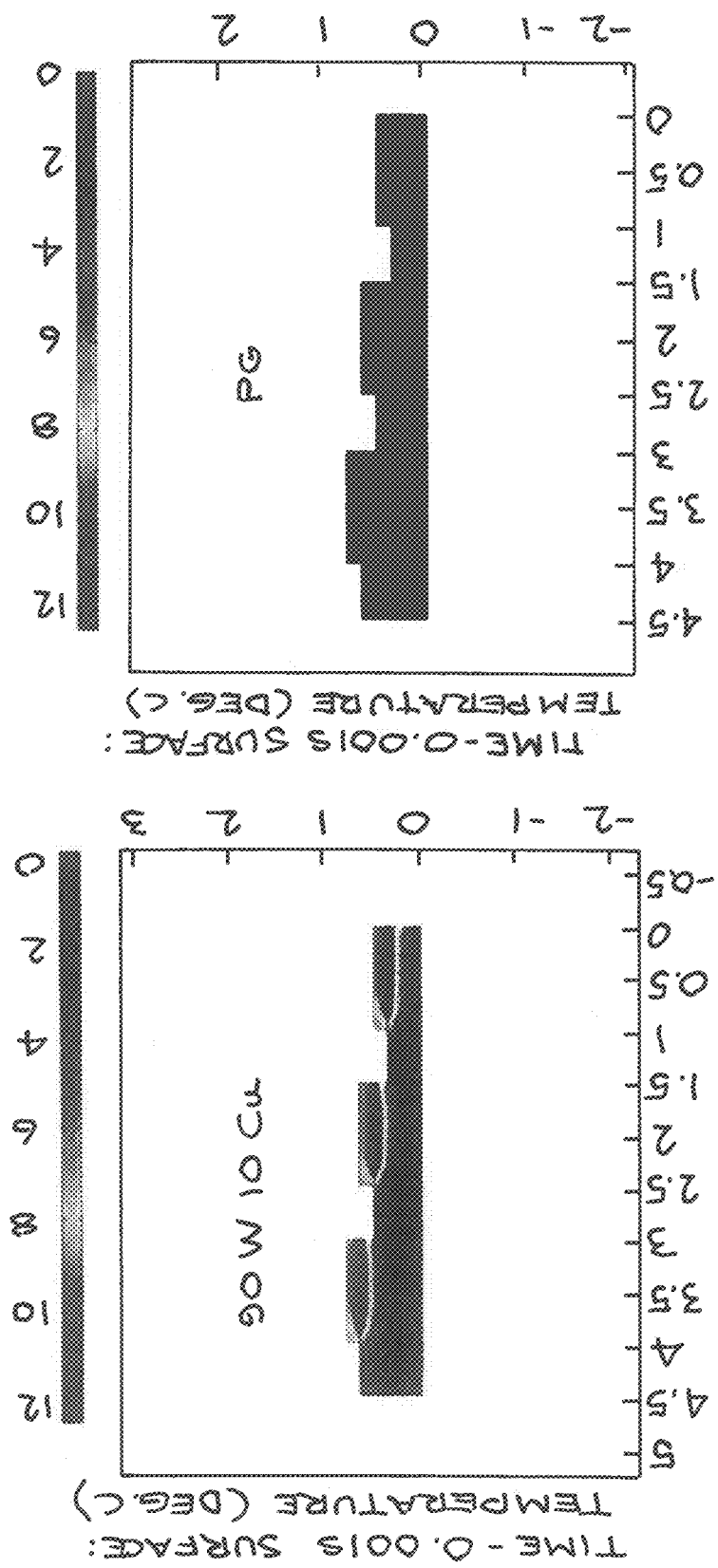
FIG. 27 shows the thermal profile of a progressively tiered PG substrate embodiment, and compared against a CuW embodiment with a same form factor.

In addition, alternative stacking strategy can be adopted with single layer tuned PG for staking by using stair-case mode as shown by the embodiment 50 shown in FIG. 27. Similar to other embodiments, the substrate body has a PG crystalline structure with at least two progressively tiered mounting surfaces for mounting a heat generating materials (e.g. 51, 52, 53) having longitudinal axes parallel to each other, and a basal plane oriented at a pre-determined orientation angle as measured from the longitudinal axes, so that a coefficient of thermal expansion (CTE) of the PG substrate is substantially matched with a CTE of the material. For comparison, and CuW substrate 40 having the same progressively tiered form factor for use with heat generating materials (e.g. 41, 42, 43) was produced with poor thermal management.

Although the description above contains many details and specifics, these should not be construed as limiting the scope of the invention but as merely providing illustrations of some of the presently preferred embodiments of this invention. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present invention fully encompasses other embodiments which may become obvious to those skilled in the art. In the claims, reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present invention, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

We claim:

1. A pyrolytic graphite (PG) substrate comprising:
a substrate body having a PG crystalline structure with a basal plane oriented at a pre-determined orientation angle as measured from a longitudinal axis of a laser diode to be mounted on a mounting surface of the PG substrate, wherein the basal plane is substantially orthogonal to the plane of the mounting surface but substantially non-orthogonal and non-parallel to the longitudinal axis, so that a coefficient of thermal expansion (CTE) of the PG substrate is substantially matched with a CTE of the laser diode.

2. The pyrolytic graphite (PG) substrate of claim 1, wherein the longitudinal axis of the laser diode to be mounted is substantially parallel to a plane of the mounting surface of the PG substrate.

3. A laser diode package comprising:
a laser diode having a longitudinal axis; and
a pyrolytic graphite (PG) substrate body having a mounting surface on which the laser diode is mounted and a PG crystalline structure with a basal plane oriented at a pre-determined orientation angle as measured from the longitudinal axis of the laser diode, wherein the basal plane is substantially orthogonal to the plane of the mounting surface but substantially non-orthogonal and non-parallel to the longitudinal axis, so that a coefficient of thermal expansion (CTE) of the PG substrate is substantially matched with a CTE of the laser diode.

4. The laser diode package of claim 3, wherein the longitudinal axis of the laser diode is substantially parallel to a plane of the mounting surface of the PG substrate body.

* * * * *